United States Patent [19]
O'Shaughnessy

[11] Patent Number: 6,016,081
[45] Date of Patent: Jan. 18, 2000

[54] TUNABLE OSCILLATOR USING A REFERENCE INPUT FREQUENCY

[76] Inventor: Timothy G. O'Shaughnessy, 7425 Woodmen Rd., CO SPGS, Colo. 80908

[21] Appl. No.: 09/118,215

[22] Filed: Jul. 17, 1998

[51] Int. Cl.[7] ................................ H03B 5/00; H03B 5/32
[52] U.S. Cl. ................................ 331/48; 331/50; 331/54; 331/74; 331/158; 331/179; 331/177 V; 331/186; 327/172
[58] Field of Search .................................. 331/1 R, 8, 34, 331/45, 48, 50, 52, 54, 55, 60, 74, 75, 111, 116 R, 116 FE, 143, 150, 158, 177 R, 179, 177 V, 185, 186; 327/172–175

[56] References Cited

U.S. PATENT DOCUMENTS 4,218,661  8/1980  Imamura ........................... 331/116 FE

*Primary Examiner*—David Mis

[57] ABSTRACT

A tunable oscillator includes an input for receiving an input signal from a source of precision frequency such as a CMOS quartz crystal oscillator. The tunable oscillator converts the frequency of the input signal to a first current using a frequency to current converter. The current produced is proportional to a first capacitor, C1. The first current is replicated to produce a subsequent current using a current mirror structure. The subsequent current is then used to generate a periodic signal using a current to frequency converter. The output frequency of the current to frequency converter is inversely proportional to a second capacitor, C2. As such the output frequency of the tunable oscillator is tunable by changing the value of the capacitance ratio C1/C2. The invention is suitable for applications that require a precision tunable source of frequency such as automated test equipment (ATE) and electrical instrumentation.

45 Claims, 20 Drawing Sheets

TUNABLE OSCILLATOR USING A REFERENCE INPUT FREQUENCY

CROSS-REFERENCE TO RELATED APPLICATIONS

Not Applicable

STATEMENT REGARDING FEDERALLY SPONSERED RESEARCH OR DEVELOPMENT

Not Applicable

REFERENCE TO MICROFICHE APPENDIX

Not Applicable

BACKGROUND OF THE INVENTION AND DESCRIPTION OF PRIOR ART

The present invention relates to the field of oscillator circuits and more particularly to oscillator circuits that are fabricated by using integrated circuit processes. The subject invention is a tunable oscillator that utilizes an input signal having a fixed frequency such as a crystal oscillator. The invention is useful in applications that require a low cost oscillator having an accurate and tunable output frequency.

In general, an oscillator is a circuit that converts a power supply voltage into a time dependent voltage or current waveform having frequency. Oscillators have a wide range of applications. Often oscillators are used to provide a timing reference in digital systems such as digital computers and related equipment. To obtain high performance, which includes high frequency and low error rate, the oscillator must be stable and precise. Oscillators are also used in communication systems to provide a carrier signal that is to be modulated for transmission. The carrier signal must have a stable and accurate frequency to prevent interference with other channels. Oscillators are also used in electronic instrumentation, such as signal generators, spectrum analysers and automated test equipment (ATE). Often the accuracy of the instrument is a direct function of the precision of the primary source of frequency, which is the oscillator.

Often a crystal oscillator circuit is used for applications that require frequency to be accurate within 1 per cent. The frequency tolerance of the crystal oscillator is much less than 0.1 per cent. As such crystal oscillators are well suited for many applications. However, there are many applications in which crystal oscillators are not well suited. The crystal oscillator is not well suited for most applications that require the oscillator frequency to be tuned or varied over a significant frequency range.

FIG. 1 discloses a typical prior art CMOS crystal oscillator, that includes CMOS inverter 150 and feedback resistor 130 on an integrated circuit 100, that are connected to a quartz crystal 140 and capacitors 110 and 120. CMOS inverter 150 amplifies the input voltage of the CMOS inverter. The CMOS inverter 150 provides a phase shift of 180 degrees by inverting the input signal. The output impedance of the CMOS inverter 150 and the first capacitor 110 produce a pole that provides additional phase shift that approaches 90 degrees. Quartz crystal 140 and the second capacitor 120 provides additional phase shift. As such, oscillator 100 of FIG. 1 oscillates at a frequency where the total phase shift is 360 degrees. The feedback resistor 130 provides a conductive path from the output to the input, so that CMOS inverter 140 is self biased in the high gain region.

FIG. 1 also includes CMOS inverters 160, 162 and 170. The CMOS inverter 162 provides a buffered output signal to drive an external load. The output of inverter 162 is used as an external clock signal to operate other devices at the same frequency used as the internal signal. Inverter 162 is often required to prevent degradation of the internal clock signal at the input of the CMOS inverter 150. CMOS inverters 160 and 170 provide additional amplification and buffering of the clock signal that drives the internal CMOS logic within the integrated circuit.

Quartz is piezoelectric. With proper electrical stimulation the quartz crystal 140 produces mechanical vibrations. These mechanical vibrations are then converted back to an electrical current and voltage. Over a narrow range of frequency, the mechanical vibrations occur with very small frictional losses. As such a quartz crystal requires very small power to sustain oscillations. As a consequence, the quartz crystal has very high Q and a very narrow bandwidth of operation.

FIG. 2 shows the equivalent electrical circuit of the quartz crystal 140. Quartz crystal 140 includes the elements Cp 210, Ls1 212, Rs1 214, and Cs1 218 which represent the fundamental mode. In addition quartz crystal 140 includes the elements Ls3 232, Rs3 234 and Cs3 238 representing the third overtone. Also, quartz crystal 140 includes Ls5 252, Rs5 254, and Cs5 258 which is the model for the fifth overtone, and so on. As such, quartz crystal 140 exhibits resonance at a fundamental mode, and at frequencies near the odd multiples of the fundamental mode frequency.

At low frequency inductors have low reactance and capacitors have high reactance. As the frequency increases the reactance of the inductors increase and the reactance of the capacitors decrease. In series the net reactance is the reactance of the inductors minus the reactance of the capacitors. At series resonance, the reactance of Ls1 and Cs1 are equal and the crystal has an effective resistance equal to Rs1. At a frequency just slightly above series resonance, the quartz crystal 140 exhibits parallel resonance. When parallel resonance occurs, capacitor Cs1 218 is in series with Cp 210. Cp is much larger in value than Cs1. As such the series capacitance of Cp and Cs1 is just slightly smaller than Cs1. So the parallel resonant frequency is just slighty higher than the frequency for series resonance. Any attempt to tune the quartz crystal by adding external capacitance shall cause the series capacitance of Cs1 and Cp to approach the value of Cs1.

As such the frequency of a crystal oscillator is tunable over an extremely small band of frequency. The tuning range is often only several parts per million. A typical crystal oscillator has a tuning range less than 200 Hz. The tuning range is so small that the crystal oscillator is considered "untunable".

There are various prior art techniques used to realize a tunable oscillator using a crystal oscillator reference. One such example is indirect frequency synthesis as described in U.S. Pat. No. 5,521,556 which is hereby incorporated by reference in its entirety. FIG. 3, which is labeled prior art, discloses a digital tuned oscillator (DTO). The DTO 300 uses a binary counter 310 to measure the output frequency of a voltage controlled oscillator (VCO) 320. The output of the binary counter 310 is compared to a binary input 340. If the counter output is less than the binary input 340, then the input voltage to the VCO 320 is adjusted to increase frequency. If the count is higher than the digital input, the input voltage to VCO 320 is adjusted to decrease the VCO frequency. So by changing the input code applied to input 340, the frequency of this circuit is altered.

However, indirect frequency synthesis has certain disadvantages. The circuit topology is very complex, which requires a large amount of chip area at added cost. The circuit is difficult and expensive to simulate. Another disadvantage is that frequency is adjustable only in discrete steps and as such is not continuously variable. Yet even another disadvantage is that increasing the resolution shall significantly increase the circuit complexity, thereby increasing the chip area and cost.

Direct digital synthesis, not shown, uses an input code applied to the input of a digital accumulator to compute states that are multiples of the input word. As such the output of the accumulator generates addresses that are applied to the input of a read only memory (ROM). The output of the ROM are applied to the input of a digital to analog converter (DAC). This arrangement is capable of synthesizing an arbitrary waveform programmed into the ROM.

Direct digital synthesis also has disadvantages. Direct digital synthesis has a high degree of circuit complexity. This technique requires a DAC, a ROM and an accumulator. An increase in resolution also requires a significant increase in circuit complexity. Another disadvantage is that frequency is only adjustable in discrete steps. Yet, another disadvantage is that the highest frequency to be synthesized must be less than half the frequency of the input clock. A higher clock frequency is obtainable by using a phase lock loop (PLL) to increase input frequency. However, the PLL significantly increases the circuit complexity.

In summary, the crystal oscillator produces an output signal having a very accurate and stable frequency. However, the tunable frequency range of the quartz crystal is extremely small. As such the crystal oscillator is unuseable in applications requiring a tunable oscillator. The use of frequency synthesis provides some degree of tuning. However, this tuning occurs only in discrete frequency steps. Increasing resolution provides smaller frequency steps, but then circuit complexity and cost increase significantly. Therefore, a new approach is needed for applications that require precision, low cost and tunability.

SUMMARY OF THE INVENTION

The invention is a tunable oscillator that produces an output signal that has a frequency that is both precise and adjustable. The invention utilizes an input signal having fixed frequency, or a frequency having an extremely small variance. The invention utilizes the input frequency and a capacitance ratio to produce an output frequency. As such, the output frequency has a variance resulting from variance of the capacitance ratio and the frequency variance of the input. The corresponding output frequency is very precise.

The present invention is a tunable oscillator that overcomes the limitations and disadvantages of the cited prior art. The invention is a simple circuit topology that requires less chip area and shall thereby reduce cost. The invention produces an electrical signal having an adjustable frequency. The frequency is adjustable either continuously or in discrete steps. The present invention is capable of realizing frequencies above or below the input frequency. The invention provides an output signal having frequency that accurately tracks the input frequency.

The tunable oscillator comprises a precision frequency to current converter connected to a first capacitor, and a precision current to frequency converter connected to a second capacitor. The invention includes numerous embodiments that are described herein, including all contemplated preferred embodiments.

DETAILED DISCRIPTION OF THE INVENTION

The invention is a tunable oscillator that accurately converts the frequency of an electrical signal into an electrical signal having another frequency using a capacitor ratio. The invention converts a stable fixed reference frequency into a nearly constant bias voltage or current. The bias voltage or current is then used to operate a self calibrating oscillator. Therefore, the output frequency is a very accurate ratio of the reference input frequency.

The present invention incorporates some operating principles that are disclosed in the following U.S. Patents. Each of the following U.S. Patents are hereby incorporated by reference in its entirety.

U.S. Pat. No. 5,594,388 is hereby incorporated entirely by reference.

U.S. Pat. No. 5,585,765 is hereby incorporated entirely by reference.

U.S. Pat. No. 5,552,748 is hereby incorporated entirely by reference.

U.S. Pat. No. 5,589,802 is hereby incorporated entirely by reference.

U.S. Pat. No. 4,998,075 is hereby incorporated entirely by reference.

Figure 1:
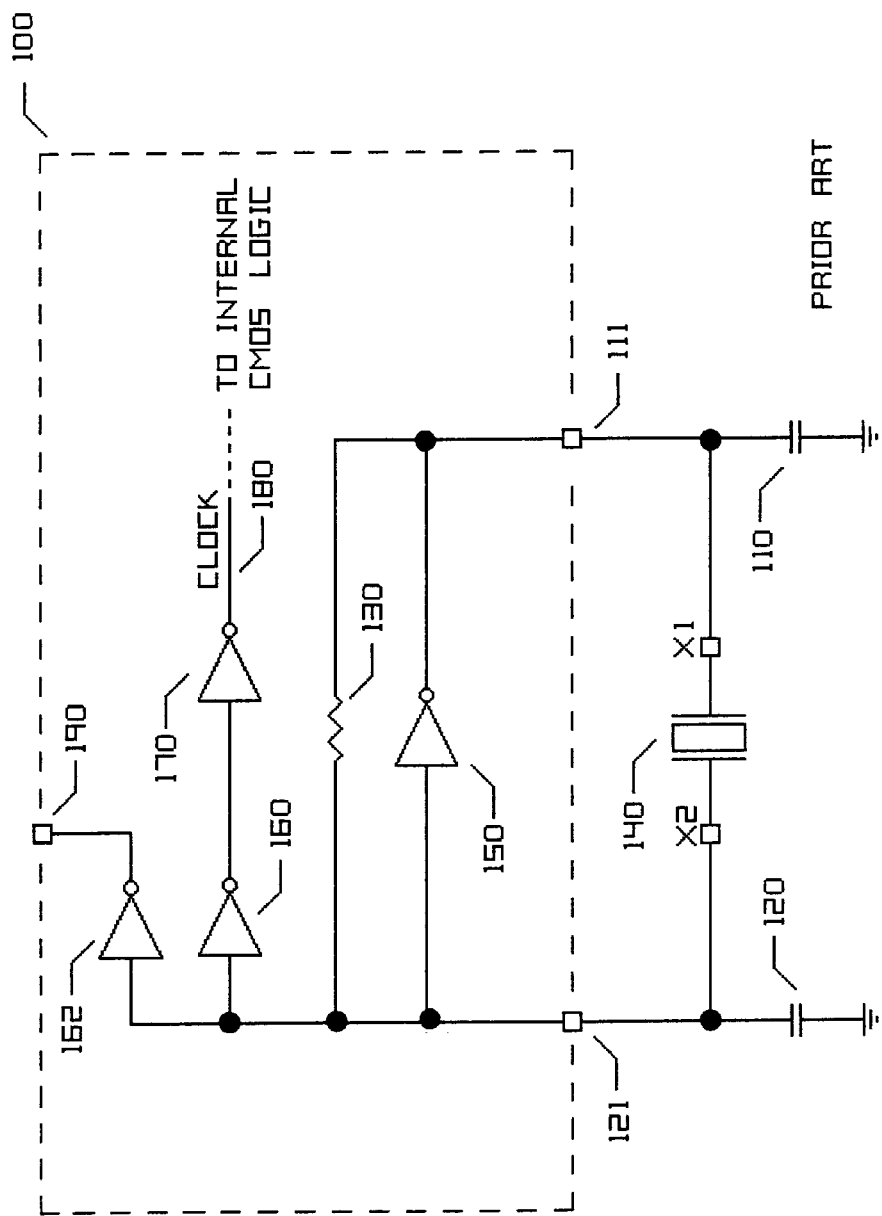
FIG. 1, labeled prior art, discloses a conventional CMOS crystal oscillator.
Figure 2:
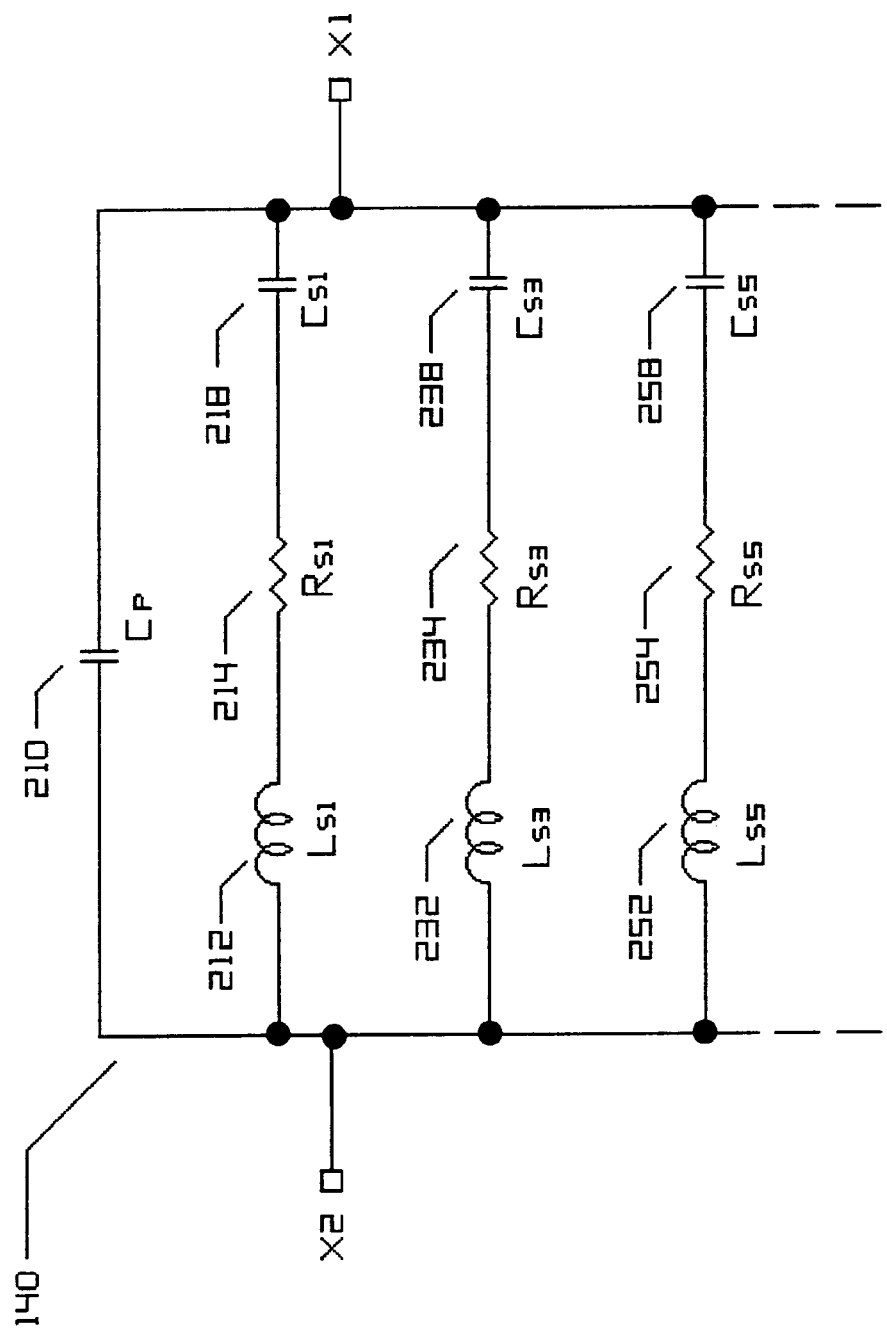
FIG. 2, labeled prior art, discloses the equivalent electrical circuit model for the quartz crystal used for operation with the oscillator of FIG. 1.
Figure 3:
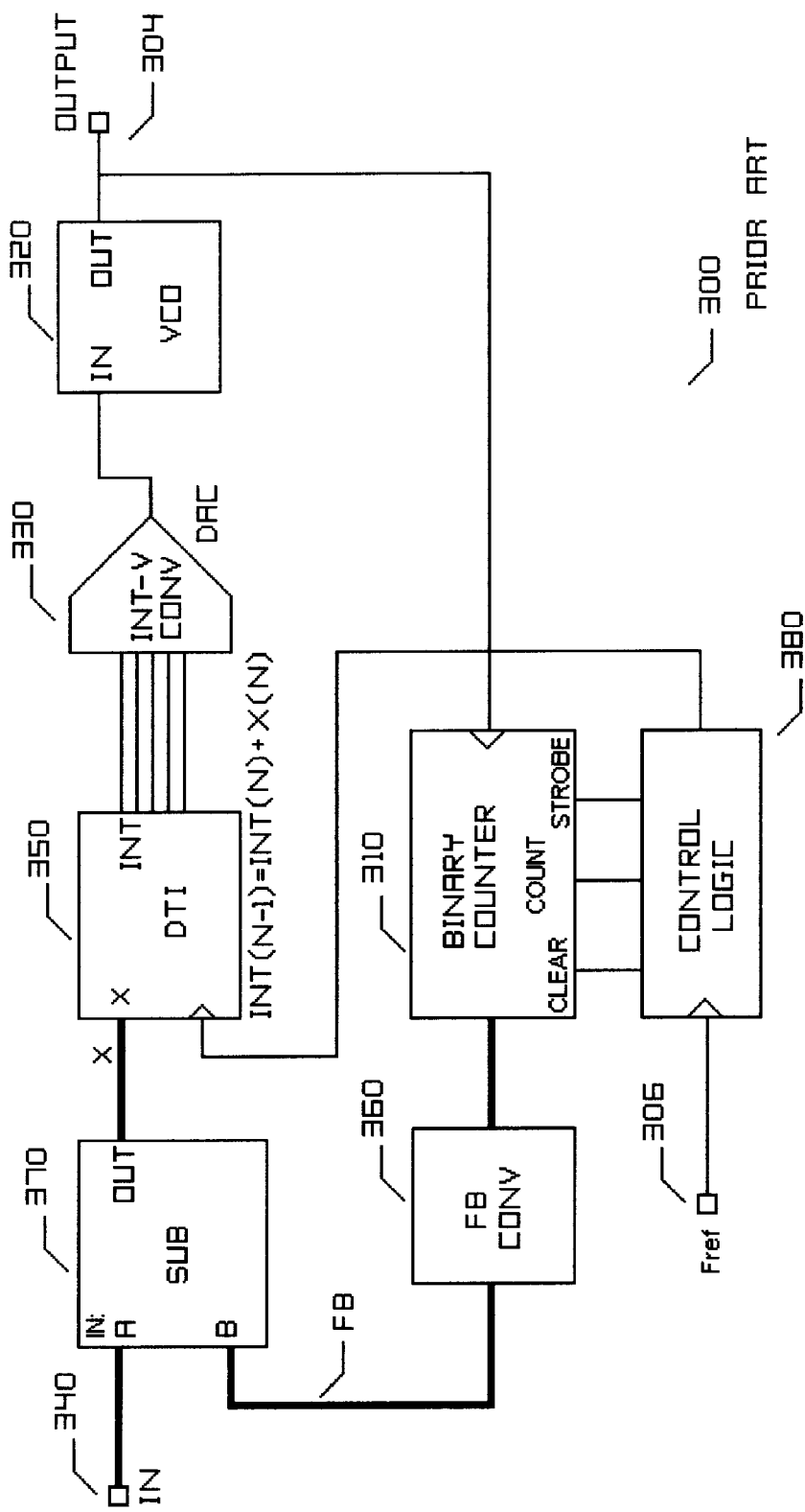
FIG. 3, labeled prior art, depicts a functional block diagram of an indirect frequency synthesis circuit.
Figure 4:
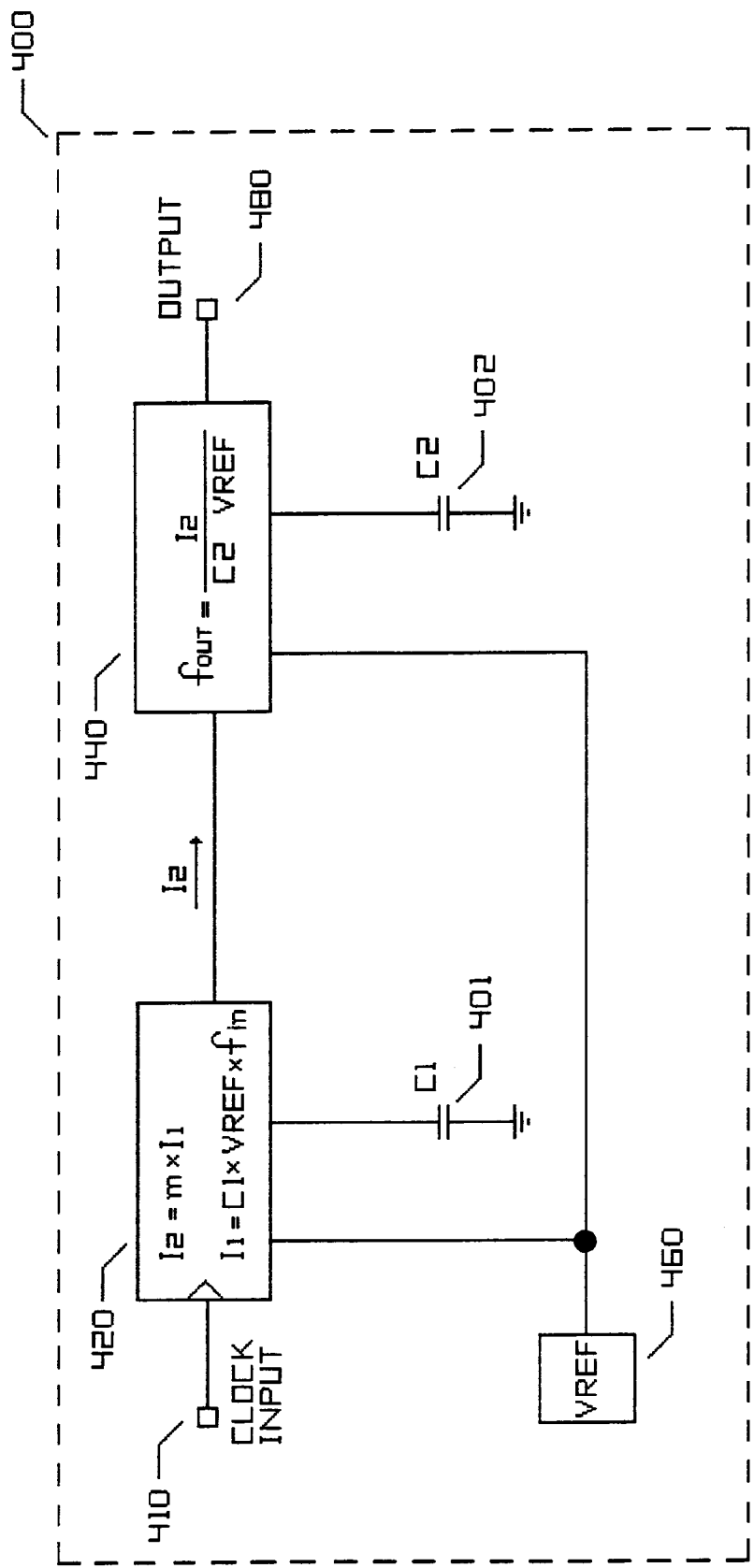
FIG. 4 illustrates a functional block diagram of an embodiment of the invention, which is a tunable oscillator.

The invention comprises a self calibrating frequency to current converter and a self calibrating current to frequency converter. FIG. 4 discloses a block diagram of an embodiment of the present invention, which is a tunable oscillator. Tunable oscillator 400 includes a clock input 410 for receiving an input signal, a self calibrating frequency to current converter 420, a self calibrating current to frequency converter 440, a voltage reference 460 that produces a voltage VREF, a first capacitor C1 401, a second capacitor C2 402, and an output 480. The first capacitor 401 is connected to frequency to current converter 420. Second capacitor 402 is connected to the current to frequency converter 440.

Tunable oscillator 400 receives an input signal having an input frequency, fin. The input frequency is converted to a first current I1 by the frequency to current converter 420. The current I1 is replicated to produce a second current I2. The second current I2 is applied to the input of the current to frequency converter 440. The current I1 is established by the classic equation:

$$I1 = C\, dV/dt$$

Where dV/dt is the rate of change of voltage with time. Therefore, $$I1 = C1\, VREF/T = C1\, VREF\, fin$$

The current I2 is replicated from current I1. As such I2 equals I1 multiplied by a design constant m. In a reverse operation the current I2 is converted to a frequency, fout.

$$I2 = C2\, dV/dt = C2\, VREF\, fout$$

$$fout = I2/(C2\, VREF)$$

$$fout = m\, I1/(C2\, VREF)$$

$$fout = m\, fin\, C1/C2$$

As such tunable oscillator 400 is tunable by changing the value of either C1 or C2. Increasing the capacitance C1 shall produce a corresponding linear increase in the output frequency. In addition, increasing the capacitance C2 shall produce a corresponding linear increase in the output period. The tunable oscillator 400 provides tuning of both frequency and period. Depending on the application, it is sometimes advantageous to have first capacitor C1 401, and second capacitor C2 402 fabricated on the integrated circuit. Yet in other applications it is more advantageous to have the first and the second capacitor 401 and 402 external to the integrated circuit.

Figure 5:
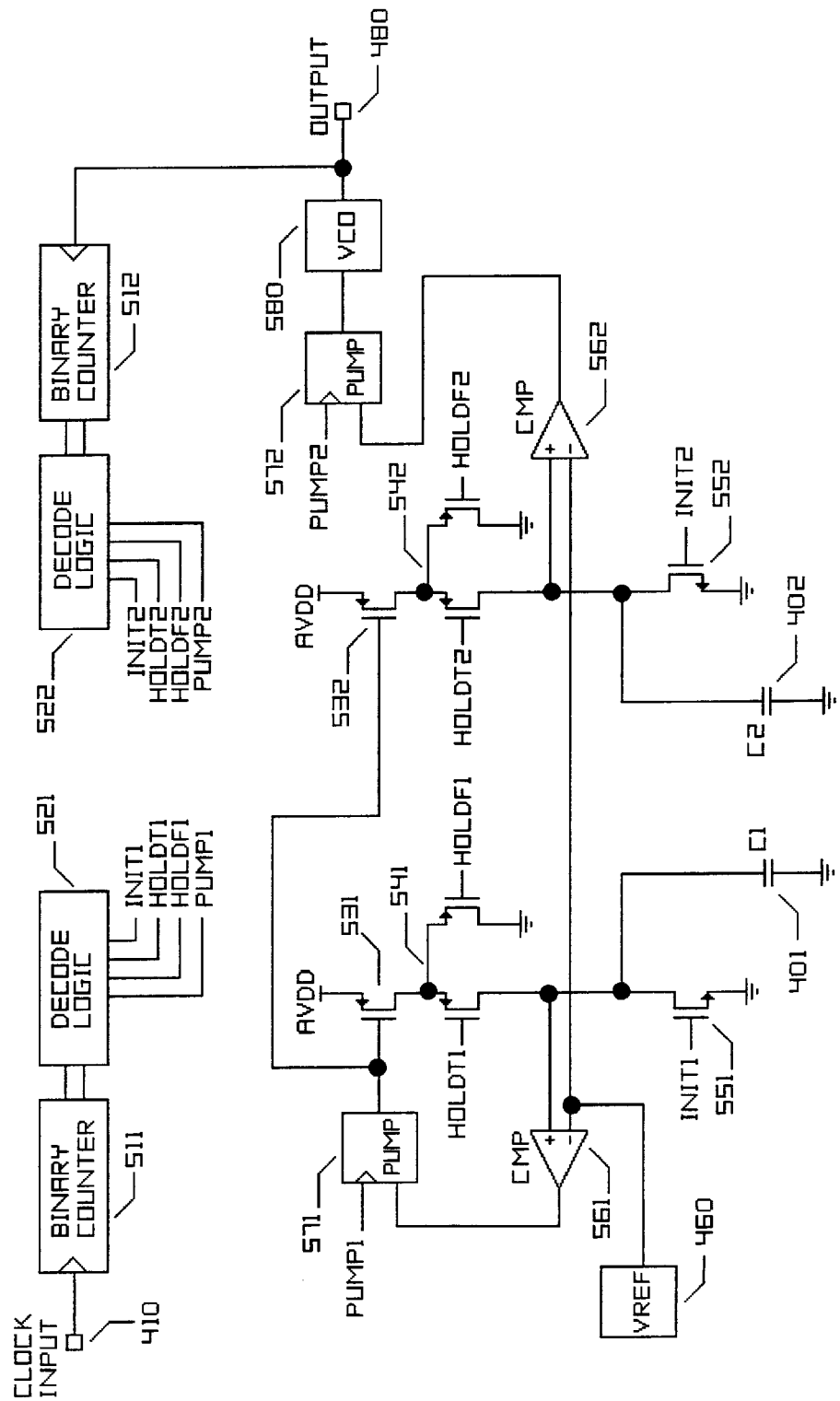
FIG. 5 illustrates a transistor level schematic diagram of an embodiment of a tunable oscillator.

FIG. 5 discloses an embodiment of the present invention in more detail. Tunable oscillator 400 includes input 410 for receiving an input clock signal, voltage reference 460, first binary counter 511, first decode logic 521, first current source MOSFET 531, first differential switch 541, first discharge MOSFET 551, first voltage comparator 561, first charge pump 571 and first capacitor 401. In addition tunable oscillator 400 also includes second binary counter 512, second decode logic 522, second current source MOSFET 532, second differential switch 542, second discharge MOSFET 552, second comparator 562, second charge pump 572, voltage controlled oscillator (VCO) 580, an output 480 and second capacitor 402.

In FIG. 5 the self calibrating frequency to current converter 420 of FIG. 4 is realized by the clock input 410, voltage reference 460, first binary counter 511, first decode logic 521, a first current source MOSFET 531, a first differential switch 541, first discharge MOSFET 551, first voltage comparator 561, first charge pump 571 and first capacitor 401. The output of the first binary counter 511 is connected to the input of first decode logic 521. The drain of first current source MOSFET 531 is connected to first differential current switch 541. The output of first differential current switch 541 is connected to first capacitor 401, to the drain of first discharge MOSFET 551 and to non-inverting input of first comparator 561. The output of the first charge pump 571 is connected to the gate of the first current source MOSFET 531.

Self calibrating frequency to current converter operates in the following manner. The input 410 receives an input signal having a frequency. The binary counter 511 responds sequentially to the input signal. The decode logic 521 produces control signals INIT1, HOLD1T, HOLD1F, and PUMP1 in response to the output of binary counter 511. Current source MOSFET 531 produces drain current I1 in response to the gate voltage produced by charge pump 571. Drain current I1 is switched by the differential switch 541 from VSS to first capacitor 401 during a charge interval when HOLDF1 is high and INIT1 is low. At the end of the charge interval, the control signal HOLDT1 transitions high and differential switch 541 steers the current I1 to VSS. During the hold interval capacitor 401 holds the charge obtained during the charge interval. The voltage across capacitor 401 is compared to VREF by comparator 561. The output of the comparator 561 determines the direction that charge pump 571 charges to.

As such self calibrating frequency to current converter forms a feedback control loop. If the current I1 is large, then capacitor 401 shall charge to a voltage greater than VREF. Then comparator 561 shall produce a high output voltage. Then the output of charge pump 571 shall increase, which reduces the drain current of current source MOSFET 531. Likewise, if drain current I1 of current source MOSFET is small, capacitor 401 shall charge to a voltage less than VREF at the end of the charge interval. Comparator 561 shall produce a low output voltage. The output of charge pump 571 shall decrease, which then increases the drain current I1 of current source MOSFET 531.

FIG. 5 also discloses the details of the self calibrating current to frequency converter 440 of FIG. 4. The self calibrating current to frequency converter 440 includes a second binary counter 512, second decode logic 522, second current source MOSFET 532, second differential switch 542, second discharge MOSFET 552, second comparator 562, second charge pump 572, voltage controlled oscillator (VCO) 580 and output 480. The output of second binary counter 512 is connected to the input of second decode logic 522. The drain of the second current source MOSFET 532 is connected to second differential current switch 542. The output of differential current switch 542 is connected to the second capacitor 402, to the drain of the second discharge MOSFET 552 and to the non-inverting input of the second comparator 562. The output of second charge pump 572 is connected to the input of the voltage controlled oscillator (VCO) 580. The VCO output is connected to the clock input of second binary counter 512.

The self calibrating current to frequency converter 440 of FIG. 4 as shown in FIG. 5 is similar in operation to the SELF CALIBRATING RC OSCILLATOR as disclosed in U.S. Pat. No. 5,559,338. The self calibrating RC oscillator converts the RC product to a signal having a frequency equal to N/4RC where N is the number of states of the binary counter. The self calibrating current to frequency converter converts input current I2 to a frequency equal to N I2/(VREF C2). The operating waveforms of current to frequency converter 440 are identical to the corresponding waveforms shown in FIG. 5 of U.S. Pat. No. 5,559,338.

The self calibrating current to frequency converter operates in the following manner. The voltage controlled oscillator (VCO) 580 produces an electrical signal having a frequency. The binary counter 512 responds sequentially to the VCO signal. The decode logic 522 produces control signals INIT2, HOLDT2, HOLDF2 and PUMP2 in response to the outputs of binary counter 512. The current source MOSFET 532 produces a drain current I2 duplicated from I1 using the same gate to source voltage of current source MOSFET 531. The drain current I2 of second current source MOSFET 532 is switched by the differential current switch 542 from VSS to charge second capacitor 402 during a charge interval. The capacitor 402 charges when HOLDF2 is high. The current I2 is switched back to VSS during a hold interval when HOLDT2 is high. During the hold interval, capacitor 402 holds the charge that occurred during the charge interval. The voltage across capacitor 402 is compared by the second comparator 562 to VREF. The output of comparator 562 controls the direction charge pump 572 charges to. The output of charge pump controls the frequency of the VCO 580.

As such the self calibrating current to frequency converter forms a feedback control loop. If the frequency of the VCO 580 is small, capacitor 402 shall charge to a voltage greater than VREF during the charge interval. The output of comparator 562 shall transition high which causes the output voltage of charge pump 572 to increase. This causes the frequency of the VCO 580 to increase. Likewise, if the frequency of VCO 580 is high, then capacitor 402 shall charge to a voltage less than VREF. The output of comparator 562 shall transition low. This produces a decreasing voltage at the output of charge pump 572. The decreasing input voltage to VCO produces a decrease in the VCO output frequency.

When operated together the frequency to current converter and the current to frequency converter form a precision tunable oscillator. The drain current I1 of first current source MOSFET is proportional to the input frequency fin and the capacitance C1 of capacitor 401. The output frequency of VCO 580 is directly proportional to the drain current I2 of the second current source MOSFET 542 and inversely proportional to the capacitance C2 of capacitor 402.

The output frequency of tunable oscillator 400 is adjustable even with a fixed or constant input frequency. Yet the output frequency is a direct function of input frequency, fin. The output frequency is a precise function of capacitance ratio C1/C2. Capacitance ratios on the same integrated circuit chip are very precise. As such, tunable oscillator 400 shall produce an accurate and stable variable output frequency with an accurate fixed input frequency. When the tunable oscillator 400 is used together with a crystal oscillator, the combination appears as a tunable crystal oscillator.

The self calibrating frequency to current converter structure of FIG. 5 provides enhanced performance. The binary counter 511 and decode logic 521 convert the high frequency digital clock signal to low frequency digital control signals. The analog signal processing of charging the capacitor 401, holding the charge on capacitor 401, and comparing the hold voltage to VREF by comparator 561 all occur at a lower frequency, having adequate settling times. As such self calibrating frequency to current converter of FIG. 5 is very precise.

The self calibrating current to frequency converter structure of FIG. 5 provides enhanced performance. The binary counter 521 and decode logic 522 convert the high frequency VCO output signal to low frequency digital control signals. The analog signal processing of charging the capacitor 402, holding the charge on capacitor 402, and comparing the hold voltage to VREF by comparator 562 all occur at a lower frequency. As such the self calibrating current to frequency converter of FIG. 5 is very precise. Together the self calibrating frequency to current converter and the self calibrating current to frequency converter form a precision tunable oscillator.

Figure 6:
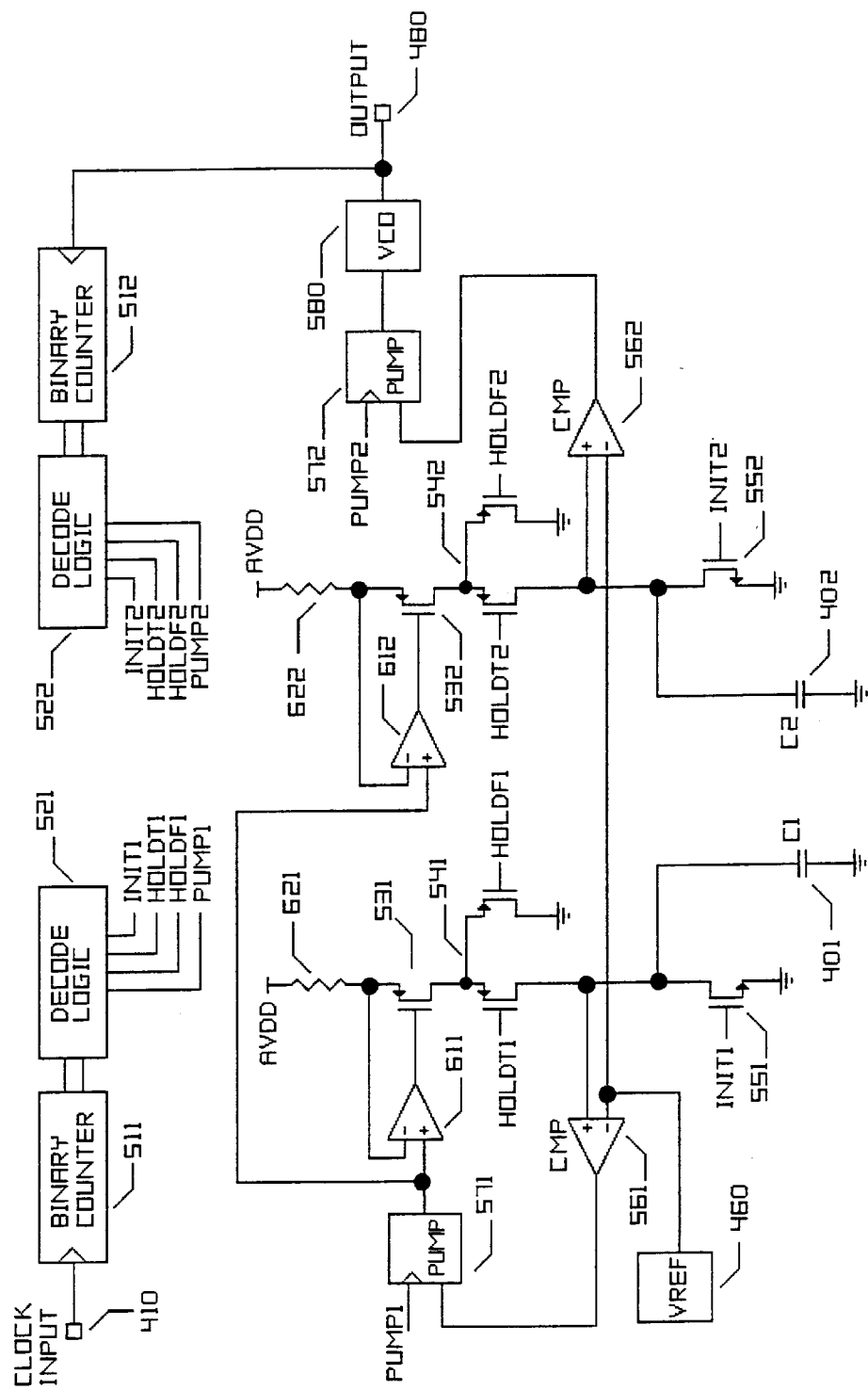
FIG. 6 illustrates a transistor level schematic of another embodiment of a tunable oscillator having improved accuracy.

FIG. 6 discloses another embodiment of the invention. In FIG. 6 the tunable oscillator 400 includes all corresponding elements of FIG. 5. In addition the tunable oscillator of FIG. 6 also includes first and second self calibrating operational amplifiers 611 and 612, and first and second resistors 621 and 622. The first operational amplifier 611, first resistor 621 and first current source MOSFET 531 form a first voltage to current converter. Likewise, the second operational amplifier 612, second resistor 622 and second current source MOSFET 532 form a second voltage to current converter. In this embodiment, the currents I1 and I2 are more accurately matched. This embodiment eliminates the mismatch between I1 and I2 resulting from device mismatches of first and second current source MOSFETS 531 and 532.

In the embodiment of FIG. 5, mismatches in the device parameters of current source MOSFETS 531 and 532 shall produce an error in the matching of the currents I1 and I2. Often the largest error results from the mismatch in the MOS threshold voltage, VT. The ideal ratio of I2/I1 is m, which is the ratio of the number of identical W and L segments between MOSFETs 531 and 532, where W and L are the gate width and length. The ratio m is also the I2/I1 ratio for the current mirror formed by MOSFETs 531 and 532.

An approximate value of error resulting from VT mismatch is:

$$\text{error}=(I2/I1-m)=2[(VT1-VT2)/(Vgs-VT)]$$

For most CMOS and BICMOS processes a "worst case" VT mismatch is 10 mV. For a Vgs-VT of 1 volt, a worst case error of 2 percent shall occur. Increasing Vgs-VT to 2 volts reduces the worst case error to 1 percent. However, if the input frequency or the capacitance C1 is reduced, then I1 decreases. When I1 decreases, then Vgs-VT decreases and the error increases.

The embodiment of FIG. 6 significantly reduces the error resulting from any device mismatches between first and second current source MOSFETs 531 and 532. Output of first operational amplifier 611 is connected to the gate of MOSFET 531. The inverting input of first operational amplifier 611 is connected to the source of first current source MOSFET 531 and to first resistor 621. The output of the second operational amplifier 612 is connected to the gate of MOSFET 532. The inverting input of the second operational amplifier 612 is connected to the source of MOSFET 532 and to the second resistor 622. The non-inverting inputs of both operational amplifiers are connected to the output of the first charge pump 571.

The self calibrating operational amplifiers 611 and 612 have very small offset voltages (Vos<1 mV). As such the voltages across the resistors 621 and 622 are extremely close to the charge pump voltage applied to the non-inverting inputs of operational amplifiers 611 and 612. The resulting drain currents of both current source MOSFETs are very accurately matched. The matching error of the resistors 621 and 622 depends on geometry, process and the layers used to fabricate the resistors. In general, using polysilicon resistors with a minimum geometry of 10 microns it is possible to reliably match the resistors and the corresponding currents I1 and I2 to within 0.5 percent.

In FIG. 4, FIG. 5 and FIG. 6 a voltage reference 460 is disclosed. The voltage reference produces an output voltage VREF. The identical reference voltage VREF is used by both the frequency to current converter and the current to frequency converter. As such the output frequency of the current to frequency converter is independent of the reference voltage VREF. Therefore, the output voltage of the voltage reference 460 is arbitrary. Any suitable voltage such as a bandgap voltage, a diode voltage, or MOS gate to source voltage may be used. The voltage should be of sufficient value to reduce sensitivity to the offset voltages of comparators 561 and 562.

Because the reference voltage VREF is arbitrary, both comparators 561 and 562 of FIG. 5 and FIG. 6 can each be replaced with two CMOS inverters. As such the input switching threshold voltage of a CMOS inverter acts as the reference voltage. A differential comparator having one input connected to a reference voltage VREF, shall have a switching threshold voltage nearly equal to the voltage VREF. As such the differential comparator having an input signal applied to the non-inverting input responds like two inverters. Hence, two CMOS inverters may replace the function of the differential comparator. This shall reduce the circuit complexity by eliminating the voltage reference 460 and by using a pair of CMOS inverters to replace the comparators 561 and 562. However, it is important that all such CMOS inverters should be matched in width, length and orientation. In addition the design of the CMOS inverters should use width and length larger than minimum to improve matching. Such inverters fabricated on the same integrated circuit have switching thresholds that match within a few millivolts.

Figure 7:
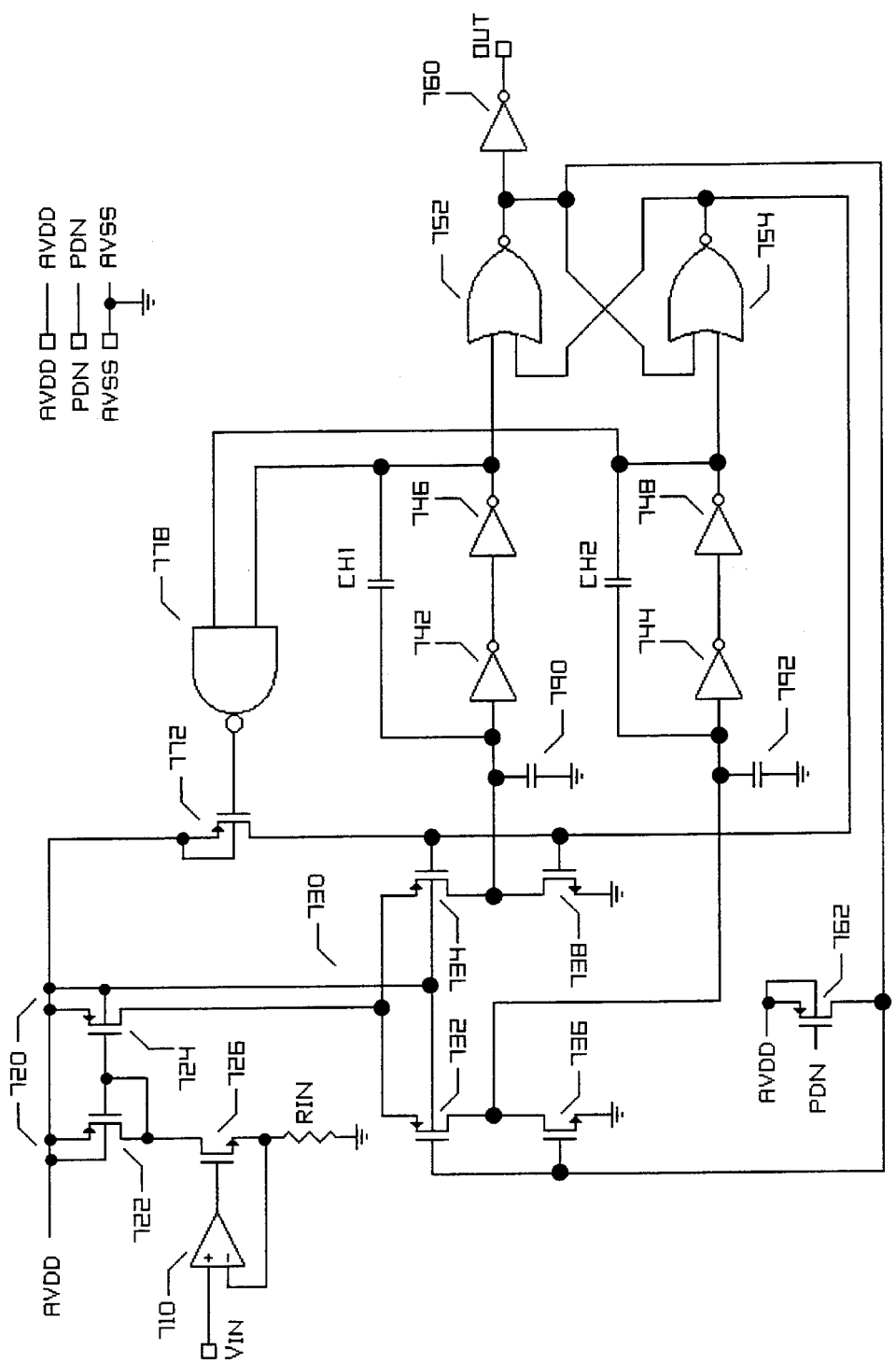
FIG. 7 is a transistor level schematic of a voltage controlled oscillator (VCO) used in FIG. 5 and FIG. 6.

The voltage controlled oscillator (VCO) of FIG. 5 and FIG. 6 is disclosed in more detail in FIG. 7 The VCO shown in FIG. 7 has been described in U.S. Pat. No. 5,589,802. The VCO comprises operational amplifier 710, resistor RIN, NMOS transistors 726, 736 and 738, PMOS transistors 732, 734 and 772, PMOS current mirror 720, CMOS inverters 742, 744, 746 and 748, cross coupled NOR gates 752 and 754, first and second capacitors 790 and 792 and fault detect NAND gate 778. The output of operational amplifier 710 is connected to gate of NMOS transistor 726. The source of NMOS transistor 726 is connected to the inverting input of operational amplifier 710 and to resistor RIN. The drain of NMOS transistor 726 is connected to the input of current mirror 720. Output of current mirror 720 is connected to both source electrodes of PMOS transistors 732 and 734. The drains of the PMOS transistors 732 and 734 are connected to first and second capacitors 790 and 792 respectively. The drains of PMOS transistors 732 and 734 are also connected to the drains of NMOS transistors 736 and 738. The inputs of cross coupled NOR gates 752 and 754 are connected to first and second capacitors 790 and 792.

A VCO control voltage is applied to the non-inverting input of operational amplifier 710. The input voltage is duplicated across RIN, thus producing a corresponding source drain current in NMOS transistor 726. The drain current of NMOS transistor 726 is the input current to P-channel current mirror 720. The output current of the current mirror 720 is steered alternately to capacitors 790 and 792 by PMOS transistors 732 and 734. The capacitors 790 and 792 are alternately discharged by NMOS transistors 736 and 738. As such the corresponding inputs of the cross coupled NOR gates 752 and 754 are alternately driven to a switching threshold voltage which causes the cross coupled NOR gate to switch states. When the control voltage 710 increases, the mirror input current increases. As such the mirror output current increases, causing first and second capacitors 790 and 792 to charge in shorter time intervals. This causes cross coupled NOR gates 752 and 754 to switch or toggle at a higher frequency.

An alternative VCO topology is realized by eliminating operational amplifier 710 of FIG. 7. The gate of NMOS transistor 726 is the VCO control input. In this topology the operation is identical to FIG. 7 except that the transfer function of voltage to frequency is less ideal. Increasing the VCO control voltage results in an increase of the voltage across RIN. The drain current of NMOS transistor 726 increases, increasing the input current to PMOS current mirror 720. This produces an increase in the current mirror output current. As such, first and second capacitors 790 and 792 alternately charge in less time producing a corresponding increase in the frequency. The operational amplifier 710 of FIG. 7 improves the linearity of the transfer function. However, the VCO is used in a feedback control loop. As such, the control loop shall correct for offset and gain errors in the transfer function if adequate loop gain is present. If there is insufficient loop gain then operational amplifier 710 must be used.

Figure 8:
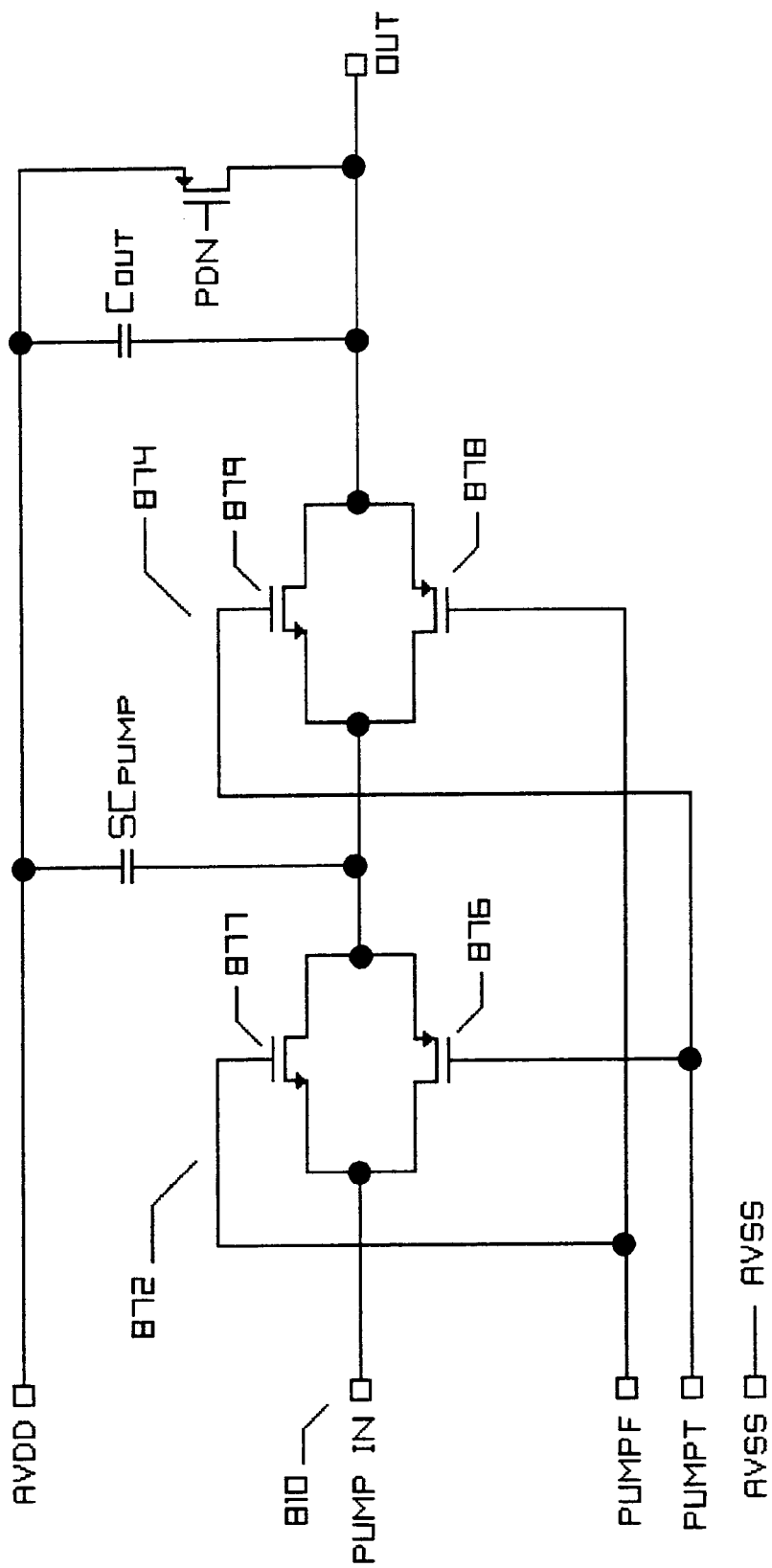
FIG. 8 is a transistor level schematic of a charge pump used in FIG. 5 and FIG. 6.

FIG. 8 discloses an embodiment of a charge pump that is used for both first and second charge pumps 571 and 572 of FIG. 5. In addition, the charge pump of FIG. 8. is also used for first and second charge pump 571 and 572 of FIG. 6. The charge pump circuit of FIG. 8 is fully described in U.S. Pat. No. 5,589,802. In FIG. 8 the charge pump includes a first capacitor Cpump, a second capacitor Cout, first N and P MOSFETs 877 and 876, second N and P MOSFETs, complimentary pump input signals PUMPT and PUMPF, a directional pump input 810, and a pump output 820. First N and P MOSFETs form a first transfer gate 872. Second N and P channel MOSFETs form a second transfer gate 874.

The charge pump operates in the following manner. An input signal is applied to the directional pump input 810. This signal must be capable of driving the switched capacitor load Cpump. When the directional input signal is high, then capacitor Cpump is charged high during a first interval when the first transfer gate 872 is conductive. When the directional pump input signal is low, then the capacitor Cpump is charged low during a first interval when the first transfer gate 872 is conductive. During a second interval, the second transfer gate 874 is conductive, and the first transfer gate 872 is off. Charge is then transferred from the first capacitor Cpump to the second capacitor Cout during the second interval. As such, the output voltage of the charge pump shall increase or decrease in incremental steps. The incremental steps respond in the same direction as the input signal applied to the directional pump input 810. The output of the charge pump is slew rate limited, and as such forms a discrete time integrator within the corresponding feedback loop.

In some applications the charge pump of FIG. 8 requires a source follower (not shown) to buffer the charge pump output when driving a resistive load, or a switched capacitor load. Such an application occurs when using the self calibrating operational amplifiers 611 and 612 in FIG. 6. The self calibrating operational amplifiers utilize a switched input capacitor to realize a near zero input offset voltage. The source follower output stage (not shown) provides a capacitive load to the second transfer gate 874 and node 820, yet is capable of supplying current required by a resistive load.

Figure 9:
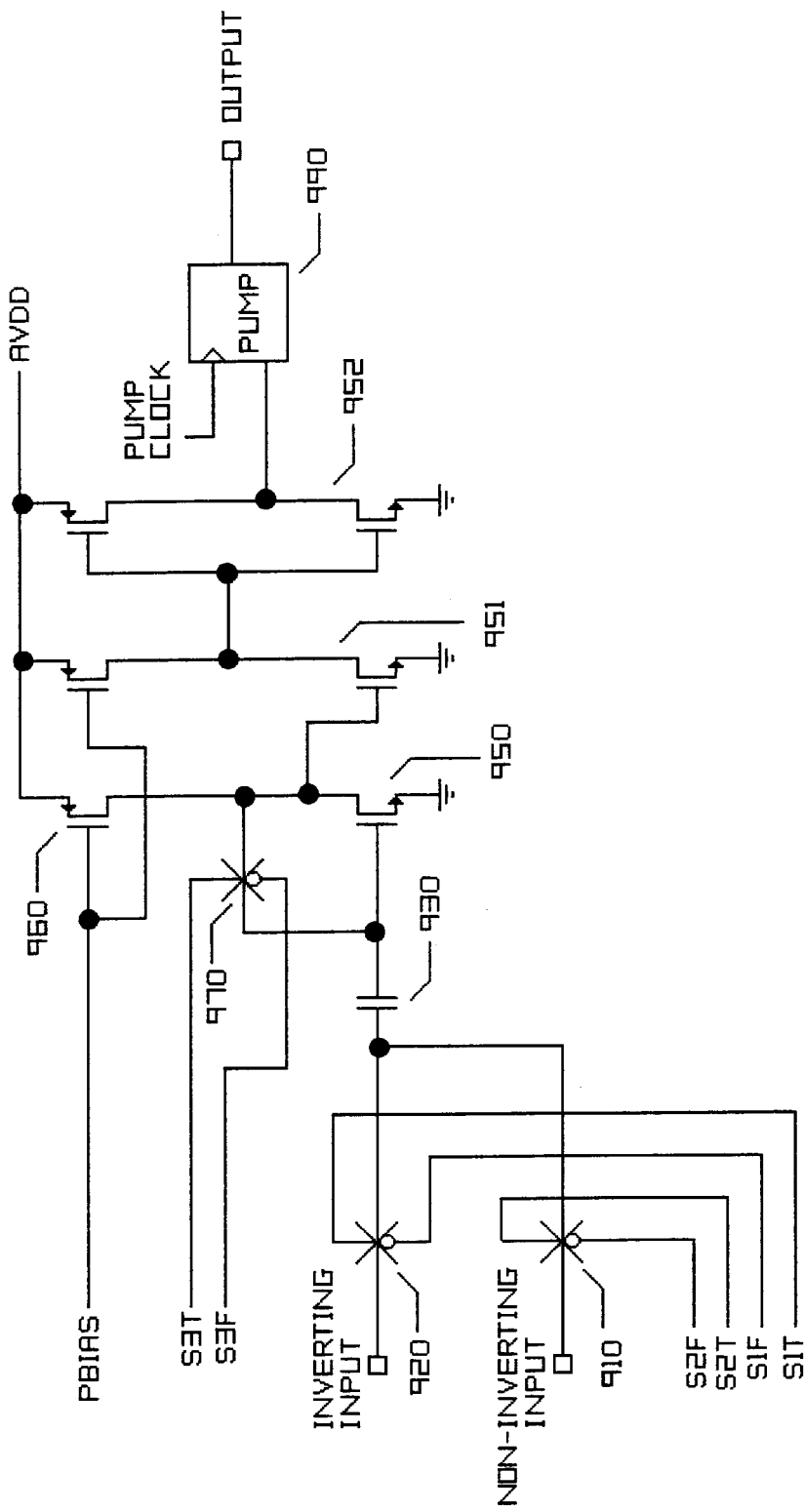
FIG. 9 is a transistor level schematic of a self calibrating operational amplifier which is used in FIG. 5 and FIG. 6.

FIG. 9 discloses an embodiment of a self calibrating operational amplifier, which is used for both operational amplifiers 611 and 612 of FIG. 6. The self calibrating operational amplifier is more fully disclosed in U.S. Pat. No. 5,594,388. The self calibrating operational amplifier includes a first transfer gate 910 and a second transfer gate 920. The first transfer gate 910 has an input connected from the non-inverting input of the operational amplifier to a capacitor 930. The second transfer gate 920 is connected from the inverting input to capacitor 930. The capacitor 930 is connected to the input of a CMOS inverter comprising NMOS transistor 950 and PMOS transistor 960. A third transfer gate 970 is connected from the drain to the gate of NMOS transistor 950.

During a first interval both first and third transfer gates are conductive and the second transfer gate is off. During this interval capacitor 930 is charged such that the non-inverting input voltage is applied to one terminal of capacitor 930. Simultaneously, the input threshold voltage of the CMOS inverter is applied to the opposite terminal of the capacitor 930. During a second interval the second transfer gate 920 is rendered conductive while the first and third transfer gates are off. During the second interval, the CMOS inverter shall respond to the voltage applied to the inverting input. Even a minute difference in voltage between the inverting and noninverting input shall produce an amplified response on the output of the CMOS inverter. The output of the CMOS inverter is amplified by subsequent CMOS inverter stages 951 and 952. Conversion to continuous time output and frequency compensation is obtained using a charge pump 990.

The disclosed embodiments of the self calibrating operational amplifier of FIG. 9, the VCO of FIG. 8 and charge pump of FIG. 7 are preferred embodiments as contemplated by the inventor at the time of filing the application. However, other embodiments of these elements exist which shall also allow one skilled in the art to make and use the invention based on this disclosure. These embodiments should not limit the scope of the invention. Rather the scope of the invention should be based on the appended claims.

Figure 10:
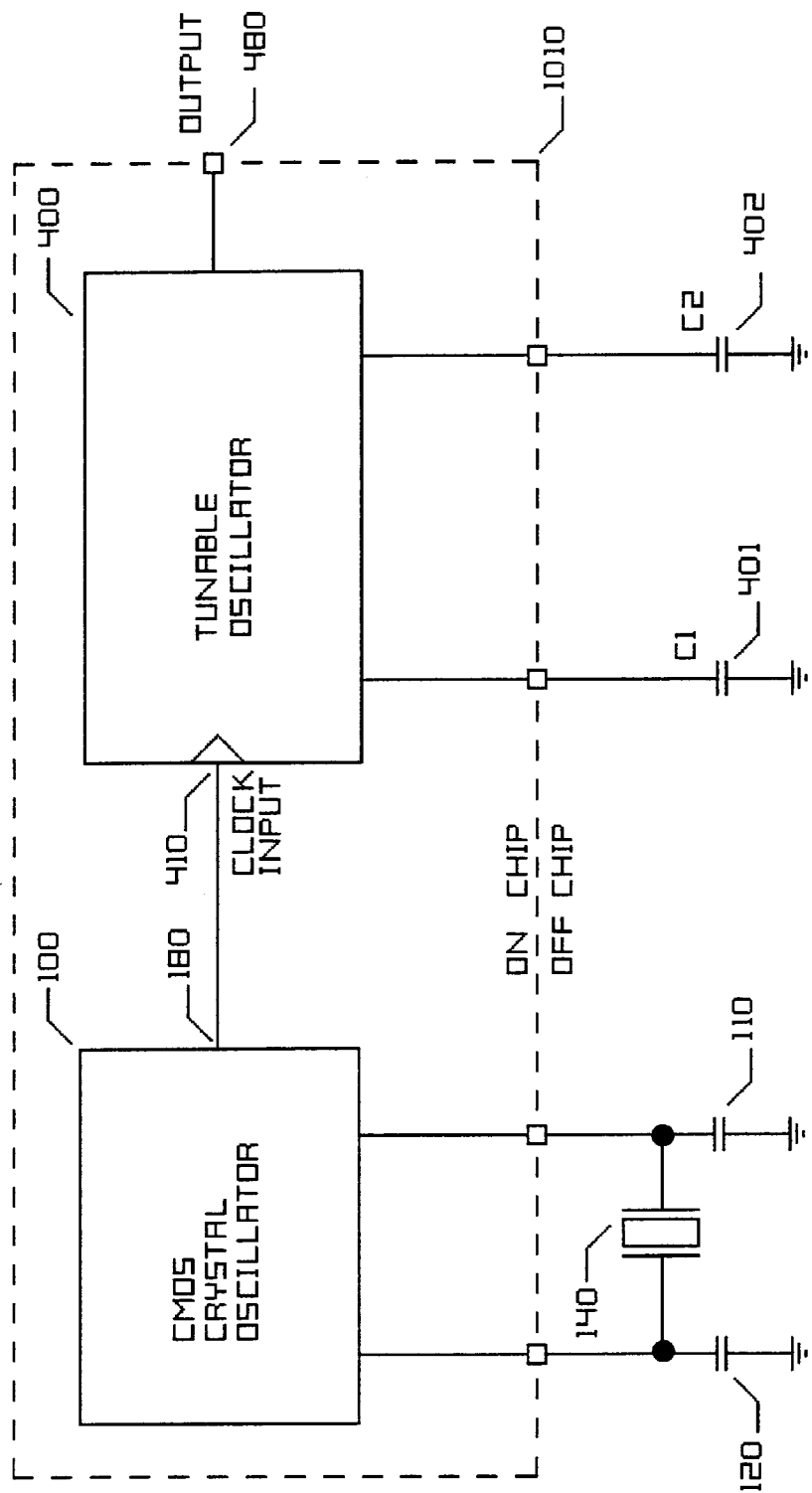
FIG. 10 illustrates another embodiment of the invention which is a tunable oscillator used with a CMOS crystal oscillator.

FIG. 10 shows an embodiment of the invention that uses a crystal oscillator 100 to provide the input frequency to tunable oscillator 400. As such, tunable oscillator 400 converts the output frequency of crystal oscillator 100, to an output frequency that has a wide tuning range. Both first capacitor 401 and second capacitor 402 are external to the integrated circuit 1010. The output frequency is adjusted or tuned using two distinct modes. In a first tuning mode, a fixed capacitor is used for the second capacitor 402. In this mode the output frequency is directly proportional to the value of the first capacitor 401. First capacitor 401 is continuously variable, or is adjusted in discrete steps. In a second tuning mode the first capacitor 401 is fixed, and the second capacitor 402 is adjusted. In this mode the output period is directly proportional to the value of second capacitor 402. The capacitance 402 is continuously variable or is adjustable in discrete steps.

Figure 11:
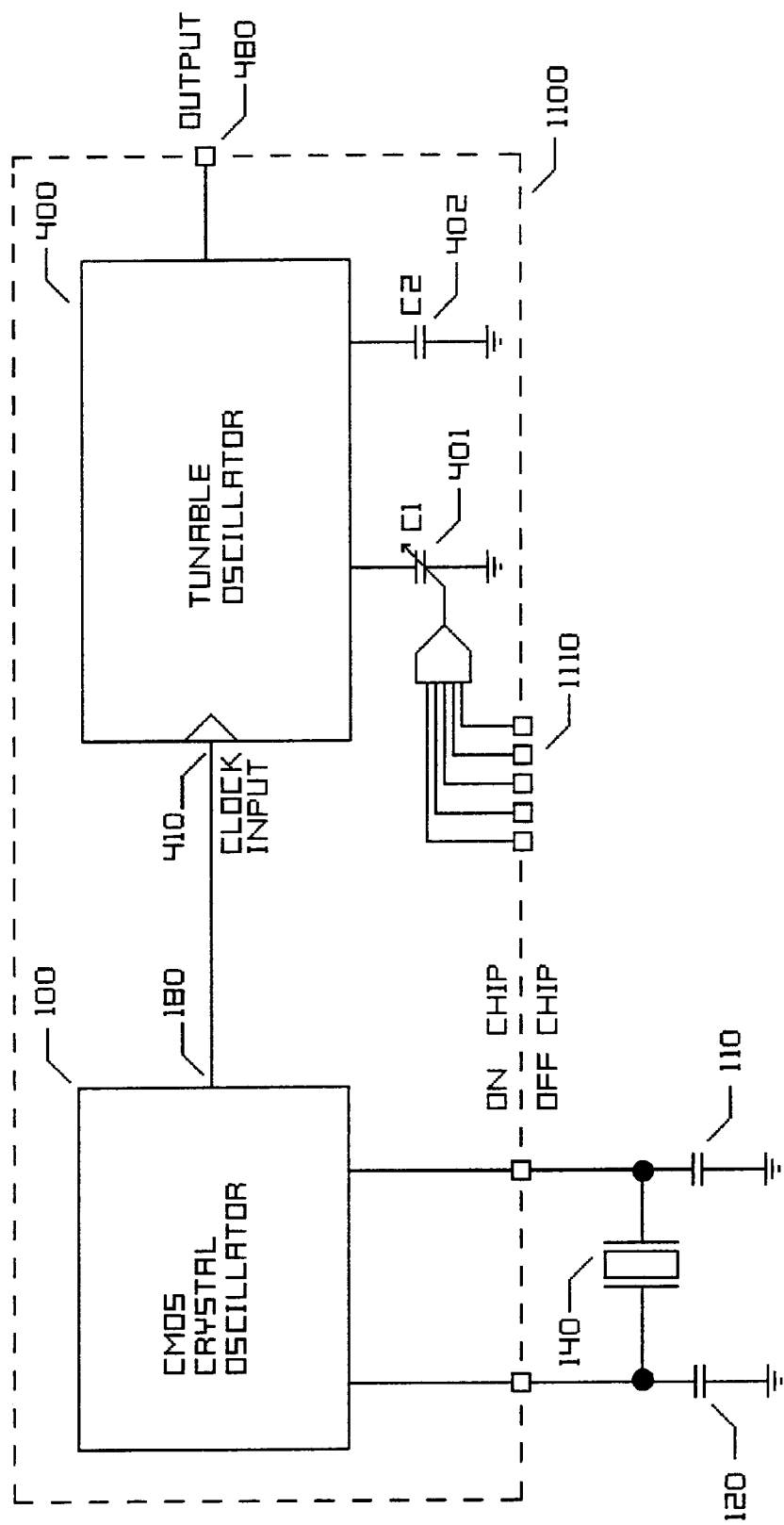
FIG. 11 depicts another embodiment of the invention which is a digital tuned oscillator, DTO.

FIG. 11 shows an embodiment of the invention that uses a crystal oscillator 100 to provide an input frequency to tunable oscillator 400. In FIG. 11 the first capacitor 401 and second capacitor 402 are fabricated on the integrated circuit. The first capacitor 401 is a switch capacitor digital to analog converter DAC. Tunable oscillator 1100 receives a digital input code that establishes the value of the adjustable capacitor 401. In this embodiment, the output frequency of tunable oscillator 400 is directly proportional to the digital input code applied to input 1110. The circuit of FIG. 11 is suitable as a single chip digital tuned oscillator DTO. The single chip DTO, the quartz crystal and a suitable power supply housed into a single unit is an adjustable oscillator, which is suitable for laboratory test equipment.

Figure 12:
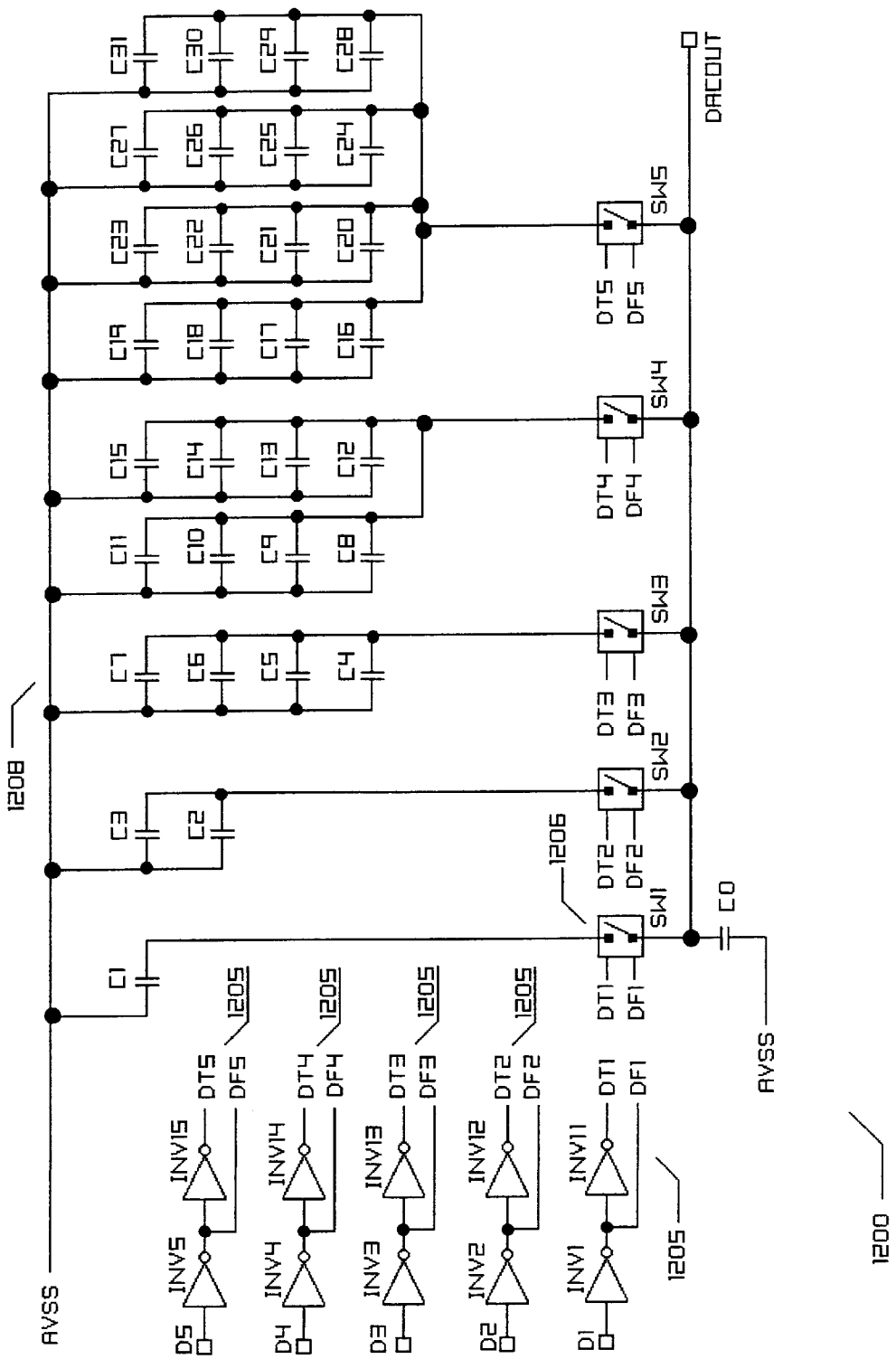
FIG. 12 is a schematic of a switched capacitor digital to analog converter DAC, used in FIG. 12.

FIG. 12 discloses in more detail the switch capacitor digital to analog converter (DAC) used as first capacitor 401. The switch capacitor DAC is described in detail in U.S. Pat. No. 5,552,748. The switch capacitor DAC 1200 includes an array of unit capacitors C1 to C31. The switch capacitor DAC also includes an offset capacitor C0 which also comprises an array of unit capacitors. Offset capacitor C0 insures a minimum output frequency and a minimum current in the frequency to current converter 420, of the tunable oscillator 400.

The switch capacitor DAC 1200 of FIG. 12 also includes an array of CMOS transfer gates SW1 to SW5. The transfer gates have complimentary input signals and respond to digital input signals 1110 of FIG. 11. The DAC receives a digital input code applied to the digital input port 1110. The input code at digital inputs D1 to D5 is applied to an array of CMOS inverters INV1 to INV5 respectively. The outputs of the CMOS inverters INV1 to INW5 are connected to the inputs of the CMOS inverters INV11 to INV15 respectively. The outputs of CMOS inverters INV11 to INV15 are named DT1 to DT5 respectively. Likewise, outputs of the CMOS inverters INV1 to INV5 are the complimentary signals DF1 through DF5 respectively. The complimentary signals are applied to the corresponding CMOS transfer gates SW1 to SW5. A digital input code shall activate the corresponding CMOS transfer gate, which shall then render the corresponding transfer gates conductive to a common output node. The total capacitance on the common node is the sum of offset capacitance C0 plus the number of unit capacitors corresponding to the digital input code.

Figure 13:
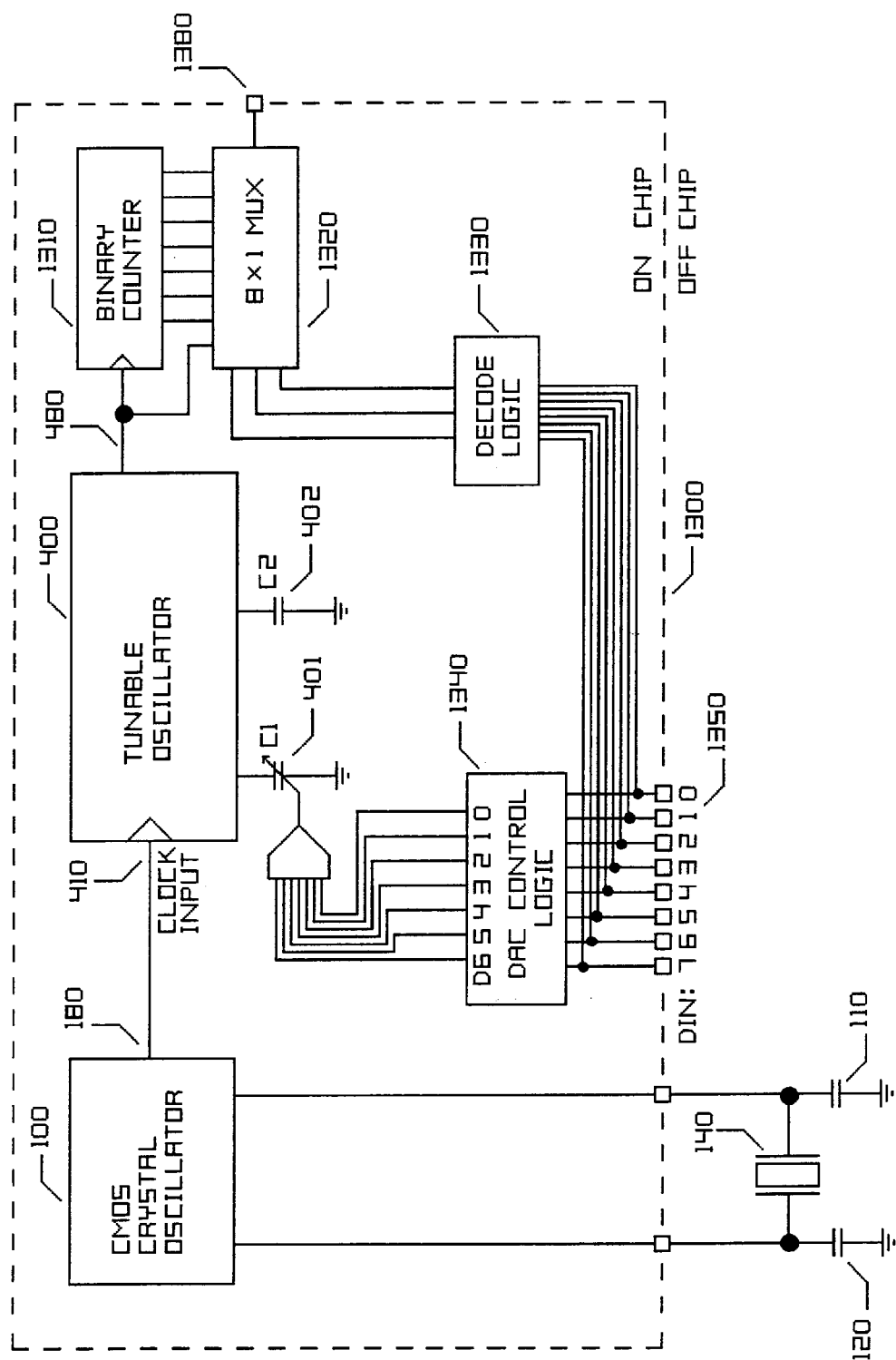
FIG. 13 depicts another embodiment of the invention which is a digital tuned oscillator DTO having improved accuracy over the structure of FIG. 12.

FIG. 13 discloses a digital tuned oscillator, DTO having improved accuracy over the circuit of FIG. 11. FIG. 13 includes a CMOS crystal oscillator 100, and tunable oscillator 400. FIG. 13 also includes first capacitor 401 which is a 7 bit version of the switch capacitor DAC disclosed in FIG. 12. In addition FIG. 13 also includes a second capacitor 402, a 7 stage binary counter 1310, an 8 input to output multiplexer 1320 (8×1 MUX), decode logic 1330, DAC control logic 1340, and an 8 bit digital input port 1350 for receiving a digital input code and an output 1380.

In this embodiment the digital input code applied to digit input port 1350 selects both the corresponding number of unit capacitors and also a preselected binary divide by ratio. When the MSB input DIN7 is high, a divide by ratio of unity is selected. The number of unit capacitors for C0 corresponds to the binary weight of the MSB. As such, the output frequency of the DTO 1300 is adjustable for values corresponding to MSB to 2MSB-1. For example, DTO 1300 has an 8 bit input code. The crystal oscillator 100 produces an output frequency of 25.6 MHz that is applied to the input of tunable oscillator 400. Second capacitor 402, has a design value of 256 pf. Switch capacitor DAC which is also first capacitor 401 has a C0 with a design value of 128 pf. The switched capacitor DAC has 127 unit capacitors having a design value 1 pf each. As such switched capacitor DAC is adjustable in digital steps from 128 pf to 255 pf. As such the DTO 1300 of FIG. 13 is adjustable in digital steps from 12.8 MHz to 25.5 MHz.

The switch capacitor DAC is 7 bits. When a logic 0 is applied to the DIN7 code input, and a logic 1 is applied to DIN6, then the 8×1 mutiplexer 1320 selects the divide by 2 output from binary counter 1310. Likewise, digital code inputs DIN5 to DIN0 are all shifted by 1 bit to become D6 to D1 of the switch capacitor DAC. As such the DIN5 code input becomes D6 of switch capacitor DAC, the code input DIN4 becomes DAC input D5 and so on, and code input DIN0 becomes DAC input D1. Also a logic 0 is applied to D0 of the switch capacitor DAC. The DAC has a digital selected capacitance value of 128 pf to 254 pf. As such an output frequency of 12.8 MHz to 25.4 MHz is generated by the tunable oscillator 400. The output frequency of the tunable oscillator 400 is divided by 2, which then provides a selected output frequency of 6.4 MHz to 12.7 MHz. When logic 0 is applied to both code inputs DIN7 and DIN6, and a logic 1 is applied to DIN5, then digital code inputs DIN4 to DIN0 are shifted by 2 bits to become D6 to D2 respectively at the input of the switched capacitor DAC. A logic 0 is applied to both D0 and D1 inputs of the DAC. The divide by 4 counter output is selected by the multiplexer. The DAC produces a digital selected value of 128 pf to 252 pf. Tunable oscillator 400 produces an output frequency of 12.8 MHz to 25.2 MHz. The 8×1 multiplexer output produces an output frequency of 3.2 MHz to 6.3 MHz.

As progressively lower value codes are applied to the digital code input, the lower code bits are shifted progressively to higher bits on the switch capacitor DAC, during which progressively higher valued outputs are selected by the multiplexer. The switch capacitor DAC always produces a minimum capacitance that is half of the full scale. In this process, the I1 current of the frequency to current converter is at least half of full scale. In addition the operating current I1 of the frequency to current converter and the corresponding current I2 of the current to frequency converter is restricted to a 2 to 1 range. Restricting the operating current improves the accuracy of the circuit. The largest gate drive voltage Vgs-VT occurs at full scale current. At full scale current, the mismatch error between I1 and I2 is minimum. Using this technique, the ratio of maximum to minimum frequency is very precise. Likewise the ratio of maximum frequency to the step change in frequency is very precise.

The embodiment of FIG. 13 is a digital tuned oscillator DTO which accurately generates an output frequency from 0.1 MHz to 25.5 MHz in 0.1 MHz steps. Using this same technique, the DTO of FIG. 13 may be also be redesigned for other applications. For example, if the DTO of FIG. 13 included three decade counters, then selectable output frequencies from 100 Hz to 25.5 KHz, 1 KHz to 255 KHz and 10 KHz to 2.5 MHz would be available. In another design using a 10 bit switch capacitor DAC, a selectable output frequency of 0.1 MHz to 102.3 MHz with 0.1 MHz steps shall be available.

Figure 14:
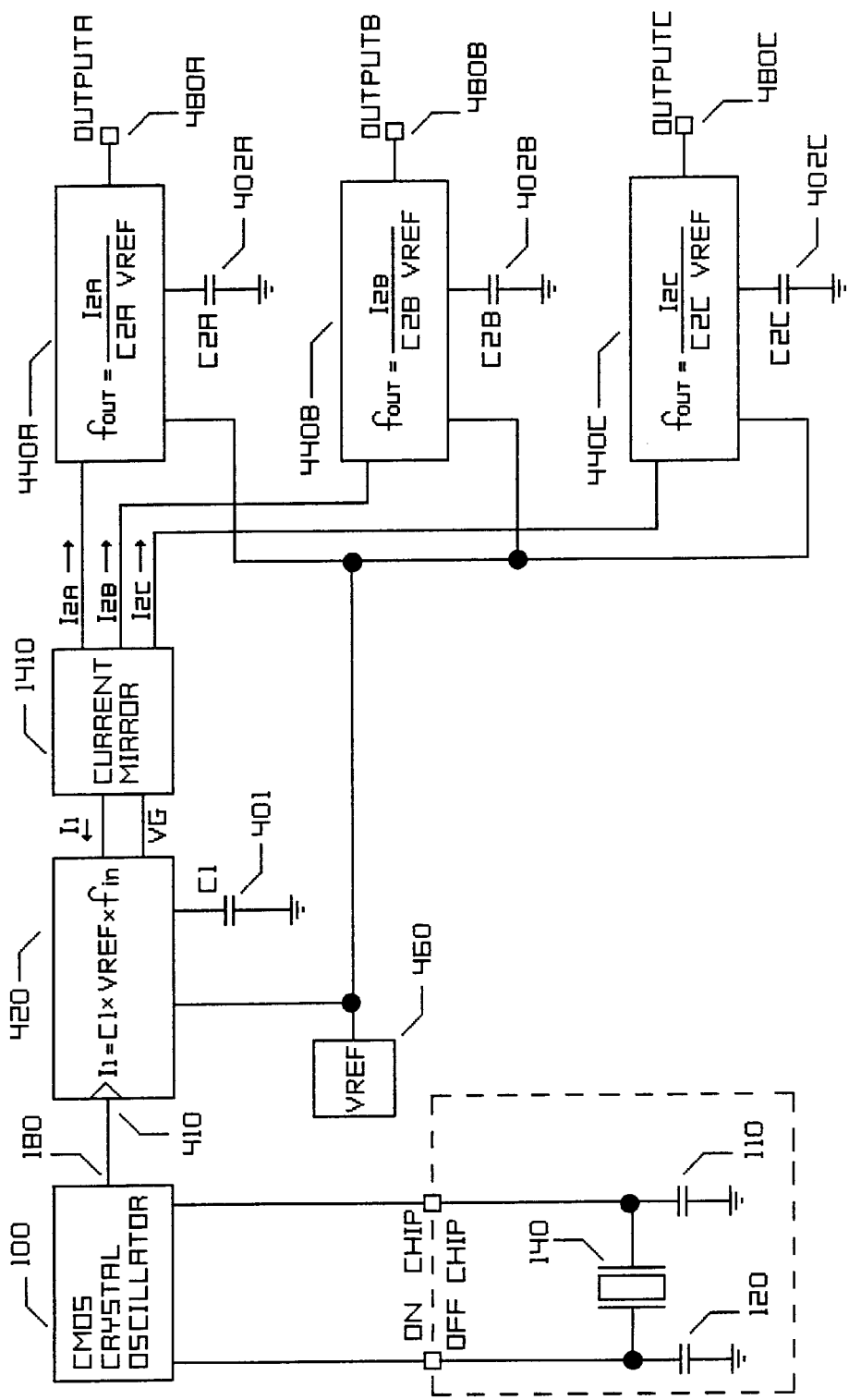
FIG. 14 depicts another embodiment of the invention which is a multiple tunable oscillator, that generates multiple output signals with different frequencies.

FIG. 14 discloses another embodiment of the invention. FIG. 14 is a diagram of a multiple programmable tuned oscillator. This embodiment of the invention comprises a single crystal oscillator 100, a single self calibrating frequency to current converter 420, a first capacitor 401, a plurality of self calibrating current to frequency converters and a corresponding plurality of 'second' capacitors. FIG. 14 also includes current mirror 1410 which replicates the current I1 into I2A, I2B and I2C respectively. The current mirror 1410 comprises additional current source MOSFET devices similar to device 532 of FIG. 5. The plurality of current to frequency converters are identified as 440A, 440B and 440C. The corresponding plurality of 'second' capacitors are identified as 402A, 402B and 402C. Each of the 'second' capacitors 402A, 402B and 402C are fixed, or continuously variable, or discretely variable or comprise switch capacitor DACs. First capacitor 401 is either fixed, continuously variable, discretely variable or comprises a switch capacitor DAC.

As such the various embodiments of FIG. 14 shall realize various behaviors. For example, assume that first capacitor 401 is a switch capacitor DAC and 'second' capacitors 402A, 402B and 402C are fixed. Then FIG. 14 becomes three oscillators in which the three output frequencies all track each other. As such all three oscillators are tuned by changing the code input to the switch capacitor DAC used for first capacitor 401. In a second example of FIG. 14, first capacitor 401 is fixed, and 'second' capacitors 402A, 402B and 402C are each a switch capacitor DAC. As such the corresponding output frequencies of the oscillators are each inversely proportional to the capacitance of the corresponding switched capacitor DAC for 402A, 402B and 402C.

In another example of FIG. 14, the first capacitor 401 is a switch capacitor DAC. 'Second' capacitor 402A is also a switch capacitor DAC, which has a code input that is independent of the code input for capacitor 401. 'Second' capacitors 402B and 402C are fixed. As such the output frequencies of current to frequency converters 440B and 440C track each other and are proportional to the input code applied to the switch capacitor DAC used for first capacitor 401. The output frequency of current to frequency converter 440A is tunable by both switch capacitor DAC used for capacitor 401 and switch capacitor DAC used for capacitor 402A. As such this example of FIG. 14 provides great flexibility in providing multiple output frequencies, as well as providing a source of fixed frequency from the crystal oscillator output 190.

Figure 15:
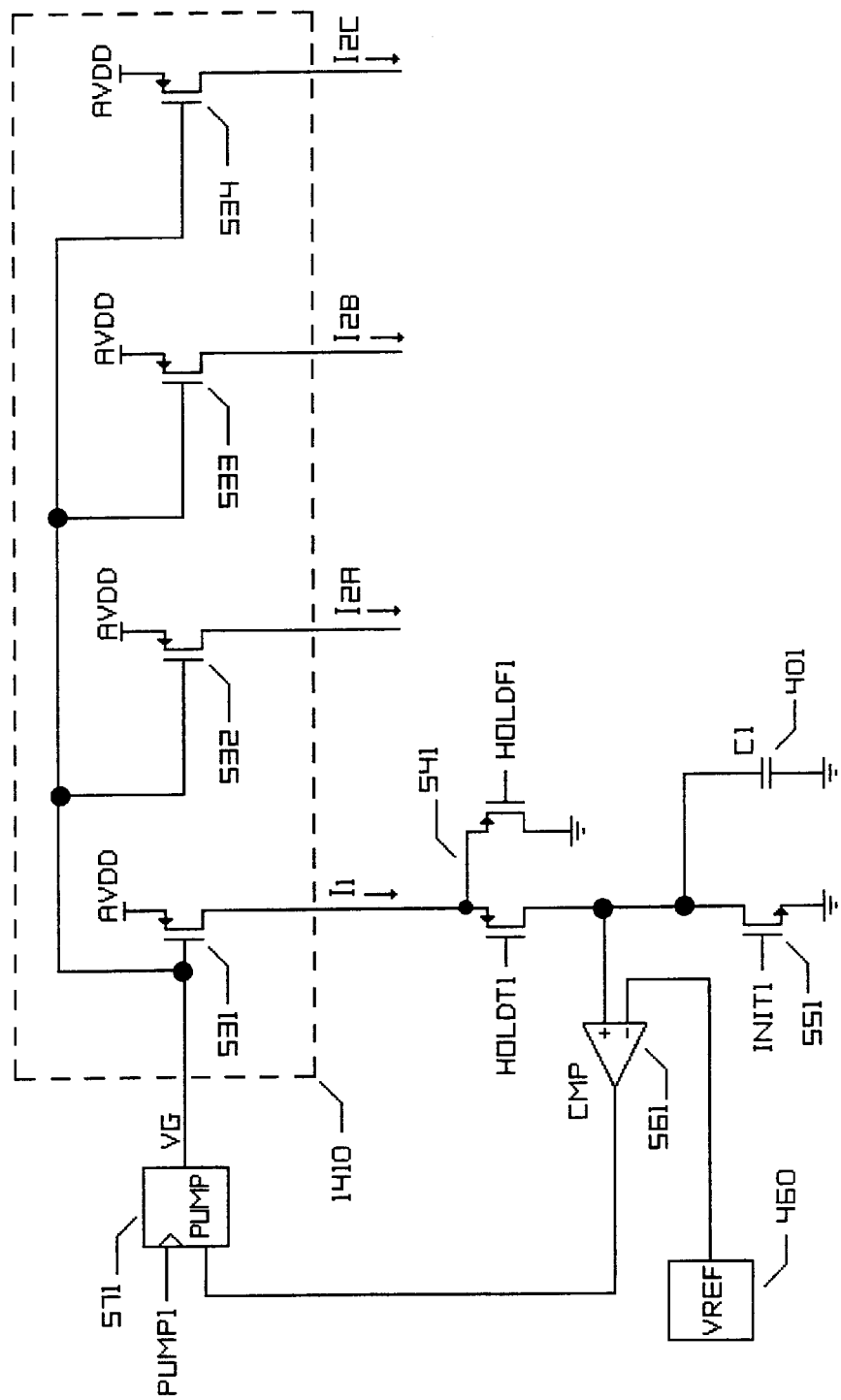
FIG. 15 shows the current mirror arrangement used in FIG. 14.

FIG. 15 discloses details of the current mirror 1410 and other circuit elements of FIG. 14. The current mirror 1410 comprises first source MOSFET 531, second current source MOSFET 532, third current source MOSFET 533 and fourth current source MOSFET 534. The gates of current source MOSFETS 531, 532, 533 and 534 are connected to the output of the charge pump 571 of frequency to current converter 420 of FIG. 14. Current source MOSFET 531 is used to establish the current I1 used to charge the capacitor 401, as previously described. Current source MOSFET 531 is part of the feedback control loop of the frequency to current converter 420. The output voltage of charge pump 571 controls the drain current of current source MOSFET 531. As such corresponding drain currents I2A, I2B and I2C are established in the current source MOSFETS 532, 533 and 534.

Figure 16:
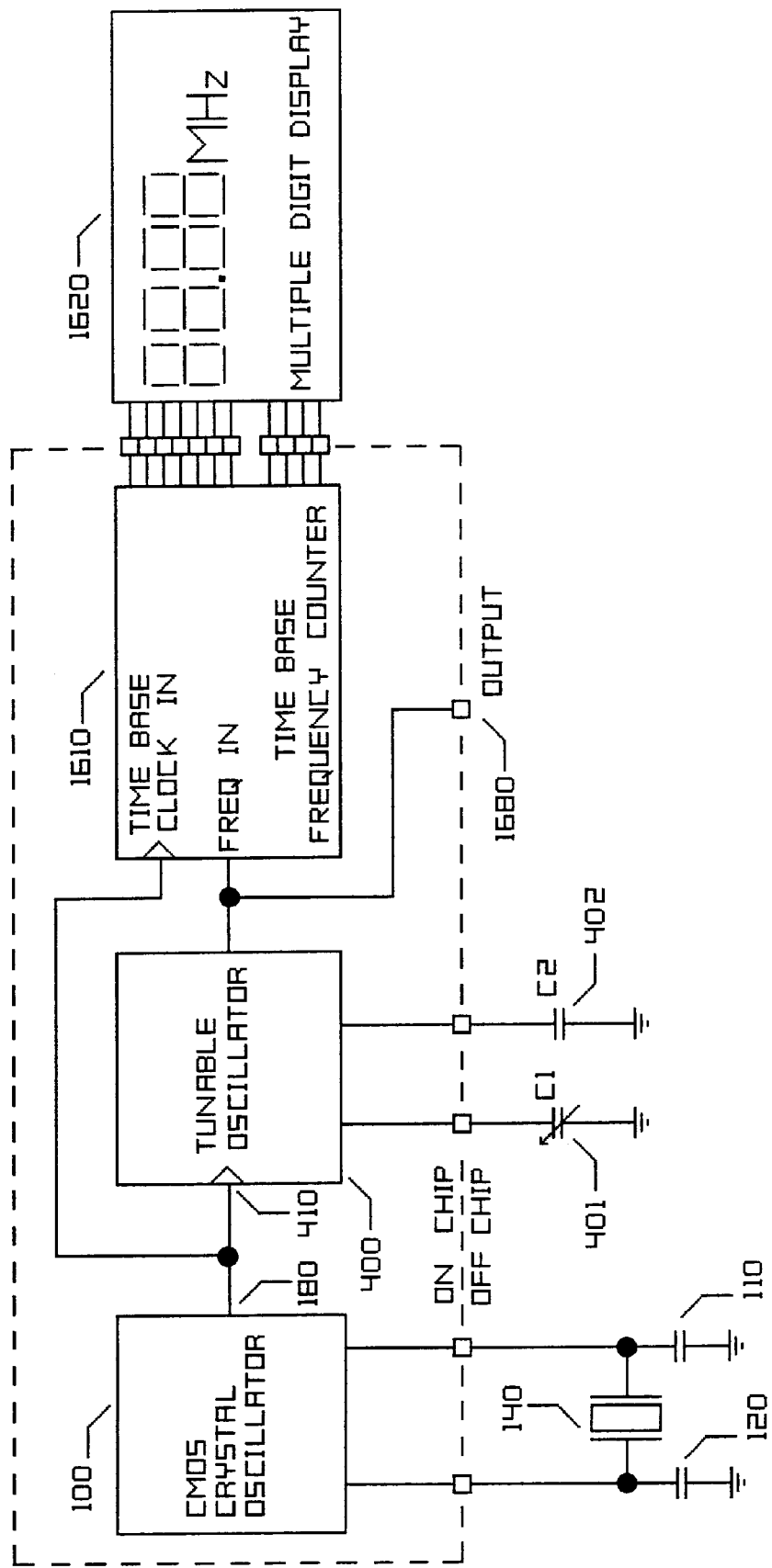
FIG. 16 illustrates another embodiment of the invention, which is a tunable oscillator that includes a display for indicating the the output frequency.

FIG. 16 provides another embodiment of the invention. The crystal oscillator 100 provides an input frequency to tunable oscillator 400. A first capacitor 401 is continuously variable and a second capacitor 402 is fixed. As such, the output frequency of tunable oscillator 400 is directly proportional to the capacitance of the variable capacitor 401. In addition FIG. 16 includes a time base frequency counter 1610, and a multiple digit display 1620. The frequency of the crystal is selected such that a suitable time base shall be obtained from the crystal oscillator frequency, perhaps 0.001 seconds. Then the output frequency of the tunable oscillator 400 is measured by the time base frequency counter. The embodiment of FIG. 16 is a tunable oscillator with a frequency counter and display that are used to indicate the output frequency of tunable oscillator 400.

In an example of FIG. 16 assume the quartz crystal 140 operates at a fundamental mode frequency of 10.00 MHz. Time base frequency counter 1610 includes a time base interval counter and a gated frequency counter. The time base interval counter has four decade counter stages (divide by 10). As such the time base is 10000 counts of the crystal oscillator output period of 0.1 micro seconds. The time base interval is 0.001 seconds. The gated frequency counter counts the positive output transitions of the tunable oscillator 400 during the 0.001 second time base interval. Therefore, the output frequency in kHz is the code value of the gated frequency counter. The gated frequency counter includes five decade counter stages. The five decade counters stages have a maximum count of 100,000 counts. The gated frequency counter counts the number of positive transitions of the output of tunable oscillator 400 for 0.001 seconds. The count of the gated frequency counter 1610 is displayed using three BCD to 7 SEGMENT display drivers (where BCD is binary coded decimal). The display drivers drive the output display 1620. Display 1620 is a light emitting diode (LED) display, or liquid crystal display, or other suitable display.

With 3 digits displayed with a fixed decimal point as shown on FIG. 16, the output frequency is shown in megahertz, MHz. When the embodiment of FIG. 16 is connected to a suitable power supply the structure is useful in instrumentation as a source of variable frequency. The display indicates the output frequency. The user sets the frequency by adjusting the variable capacitor 401 while observing the displayed frequency. When the required frequency is obtained, the unit is ready for the intended application.

Figure 17:
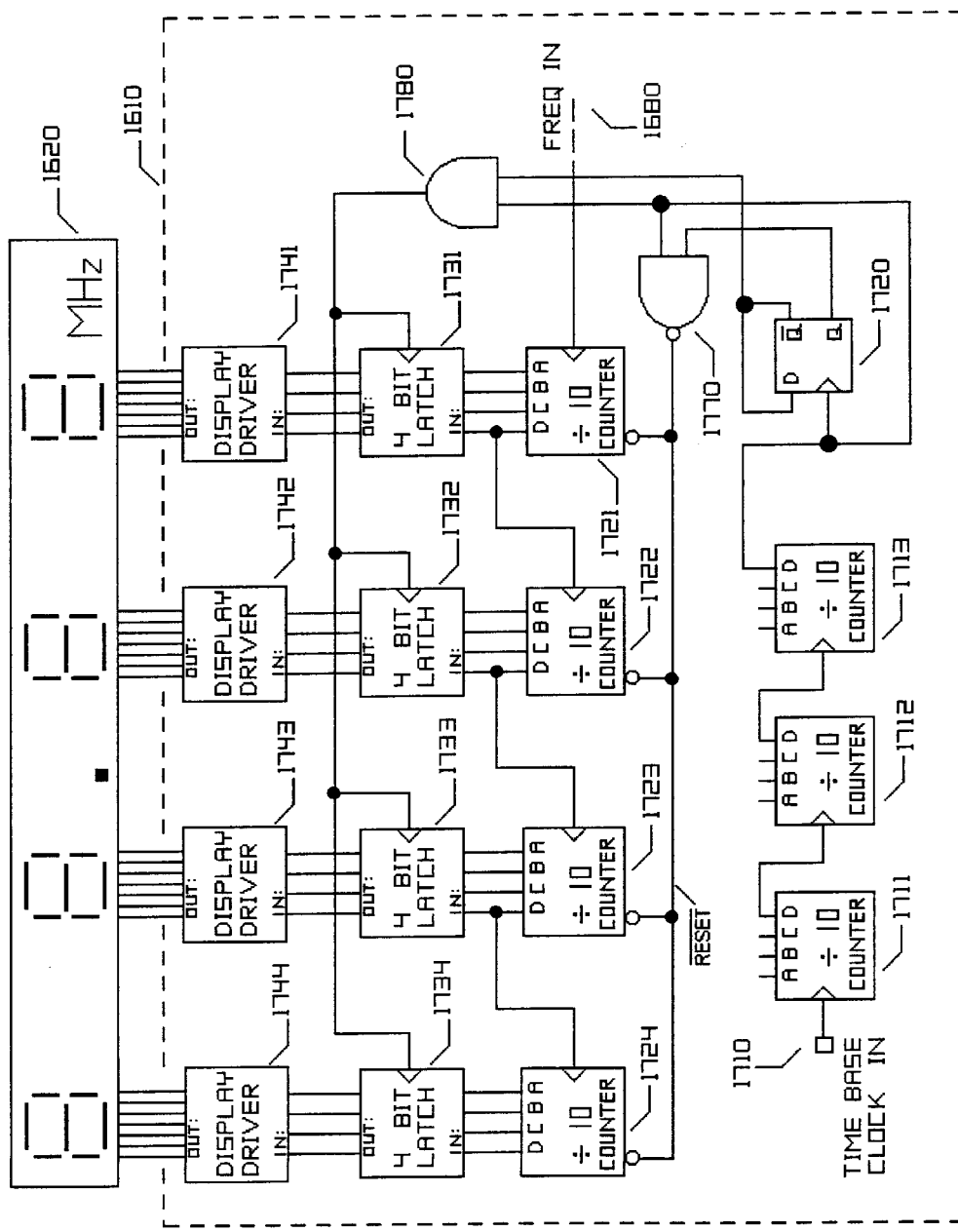
FIG. 17 shows a functional block diagram of the circuit that is used to measure the output frequency in FIG. 16.

FIG. 17 discloses a diagram showing the detail of the logic of the time base frequency counter 1610 of FIG. 16. The time base frequency counter 1610 includes a time interval counter and a gated frequency counter. The time interval counter includes three decade counters 1711, 1712, 1713, a divide by 2 flip-flop 1720, AND gate 1770 and NAND gate 1780. The gated frequency counter includes decade counters 1721, 1722, 1723, 1724 and corresponding 4 bit latches 1731, 1732, 1733 and 1734. The output of the 4 bit latches drive the inputs of display drivers 1741, 1742, 1743 and 1744.

The input of the tunable oscillator 400 is connected to the output of crystal oscillator 100. In addition the input 1710 of the time base interval counter is also connected to the output of the crystal oscillator 100. The three decade counter of the time base interval counter count negative edge transitions of the crystal oscillator output. For each 1000 cycles of the crystal oscillator output, the output of decade counter 1714 produces a low to high and a high to low transition. The output of flip-flop 1720 produces a corresponding high output and a corresponding low output for every 2000 cycles of the crystal oscillator output.

During the low interval of the Q output of flip-flop 1720, the decade counters of the gated frequency counter count the negative transitions of the output of tunable oscillator 400. When the D output of counter 1713 transitions high and the then low, the code outputs of decade counters 1721, 1722, 1723 and 1724 are latched into the 4 bit latches 1731, 1732, 1733 and 1734 respectively. The outputs of the 4 bit latches 1731, 1732, 1733 and 1734 drive the respective digital inputs of the corresponding display drivers 1741, 1742, 1743 and 1744. As such, the display 1620 indicates the numerical value of the frequency of tunable oscillator 400.

Figure 18:
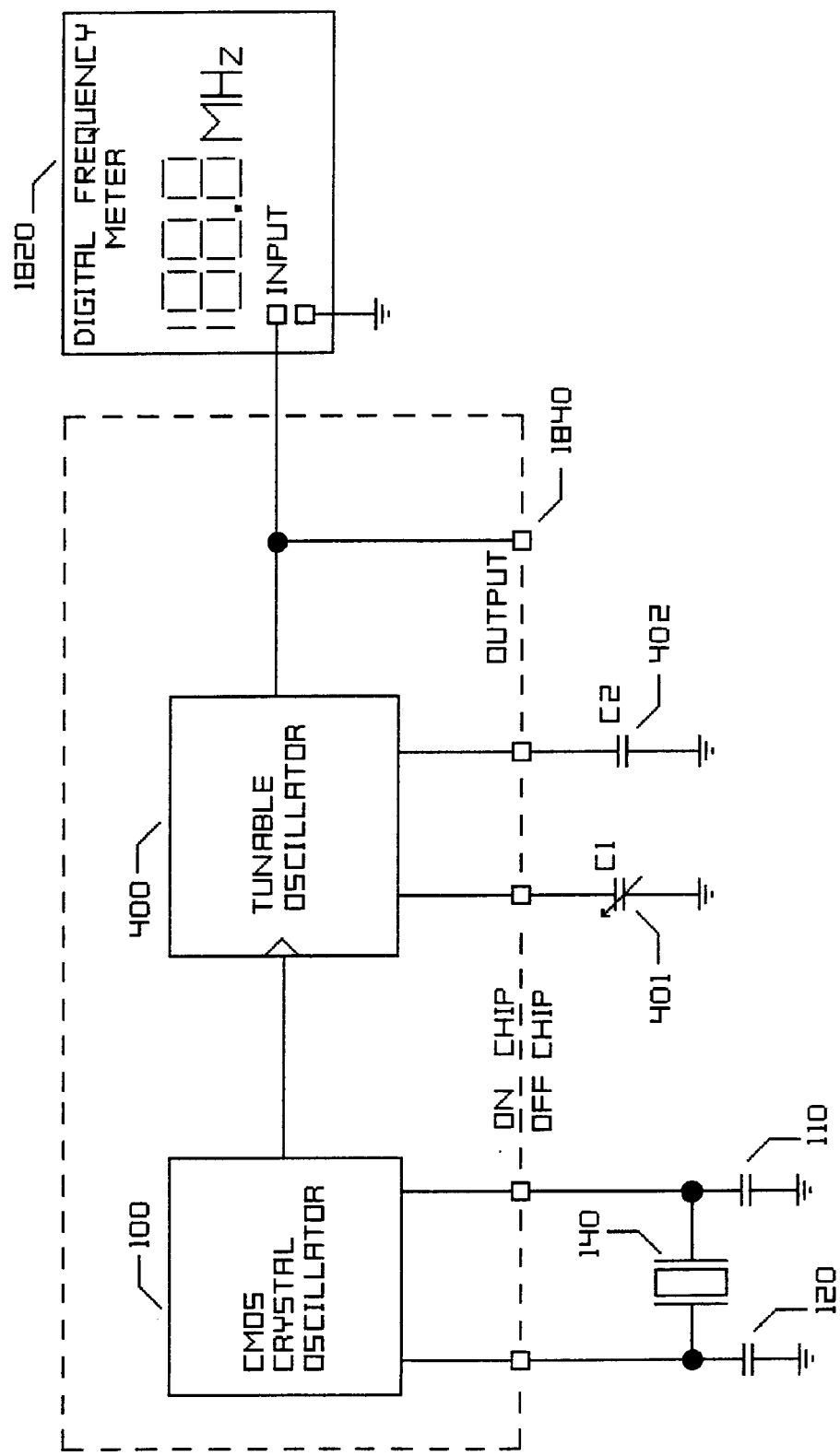
FIG. 18 illustrates an embodiment of the invention which is a tunable oscillator that includes a frequency meter to measure the output frequency.

FIG. 18 discloses another embodiment of the invention. FIG. 18 includes tunable oscillator 400 having a clock input connected to the output of CMOS crystal oscillator 100. FIG. 18 also includes a first capacitor 401 that is continuously variable and second capacitor 402 that is fixed. The output of the tunable oscillator is connected to the input of a digital frequency meter 1820. The operation of this embodiment is identical to FIG. 16. However, in FIG. 18 the digital frequency meter 1820 is completely external to the integrated circuit that includes tunable oscillator 400.

Figure 19:
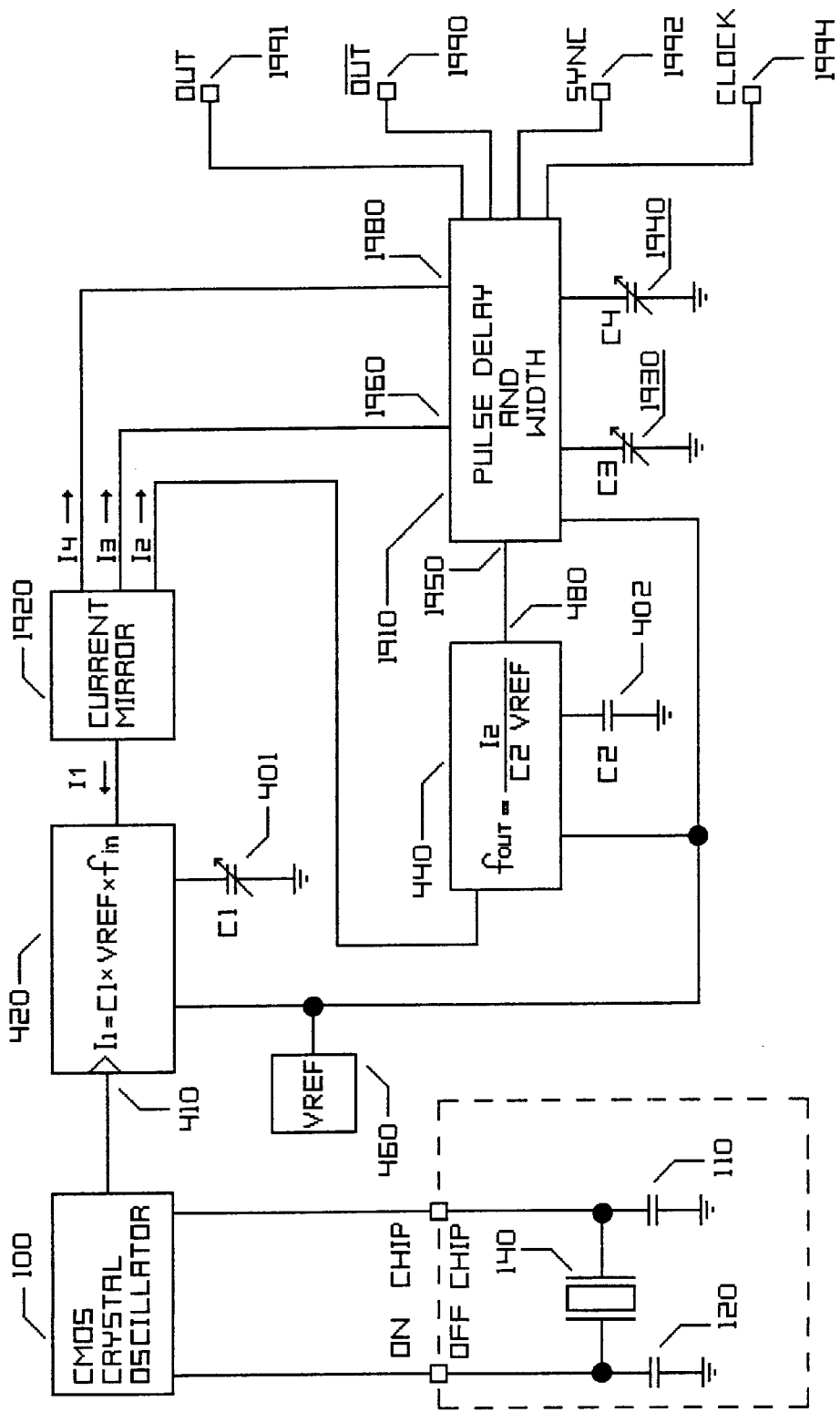
FIG. 19 illustrates another embodiment of the invention, which is a pulse generator, having a pulse delay and pulse width that track the period of the output.

FIG. 19 discloses another embodiment of the invention. In FIG. 19 a pulse generator is disclosed. This pulse generator is suitable for laboratory applications. The pulse generator of FIG. 19 includes CMOS crystal oscillator 100, frequency to current converter 420, a current mirror 1920 responsive to the current I1 of the frequency to current converter 420, current to frequency converter 440 and a pulse control circuit 1910. Frequency to current converter 420 is connected to a first capacitor 401 which is a variable capacitor. The current to frequency converter 440 is connected to second capacitor 402, which is fixed or is switched for specific frequency ranges. The embodiment also includes a third capacitor 403 and a fourth capacitor 404 which are variable for setting pulse delay and pulse width respectively. Capacitors 403 and 404 are connected to the corresponding inputs of the pulse control circuit 1920. The pulse control circuit 1920 is described in further detail in FIG. 20.

In the embodiment of FIG. 19 the current mirror 1920 generates currents I2, I3, and I4 respectively in response to the input current I1 from frequency to current converter 420. Current mirror 1920 is identical in structure and operation to the current mirror disclosed in FIG. 15. The current mirror 1920 generates the currents I2, I3 and I4 which are used to charge capacitors 402, 403 and 404 respectively. As such the pulse period, pulse delay and pulse width track and scale together as the frequency is adjusted by changing the capacitance of variable capacitor 401.

The pulse generator of FIG. 19 operates in the following manner. The CMOS crystal oscillator 100 generates an output signal with a frequency established by quartz crystal 140. CMOS crystal oscillator output 180 is connected to the frequency to current converter input 410. The frequency to current converter 420 produces a current I1 in response to the frequency of the CMOS crystal oscillator 100. Current mirror 1920 generates the currents I2, I3 and I4 in response to the current I1. The current to frequency converter 440 produces a signal at the output 480 having a frequency that is proportional to the capacitance ratio C2/C1 times the output frequency of CMOS crystal oscillator. The pulse control circuit 1910 produces a pulse delay proportional to C3/C1 times the period of the signal at the crystal oscillator output. The pulse control circuit 1910 produces a pulse width proportional to the capacitance ratio C4/C1 times the period of the signal at the crystal oscillator output.

Figure 20:
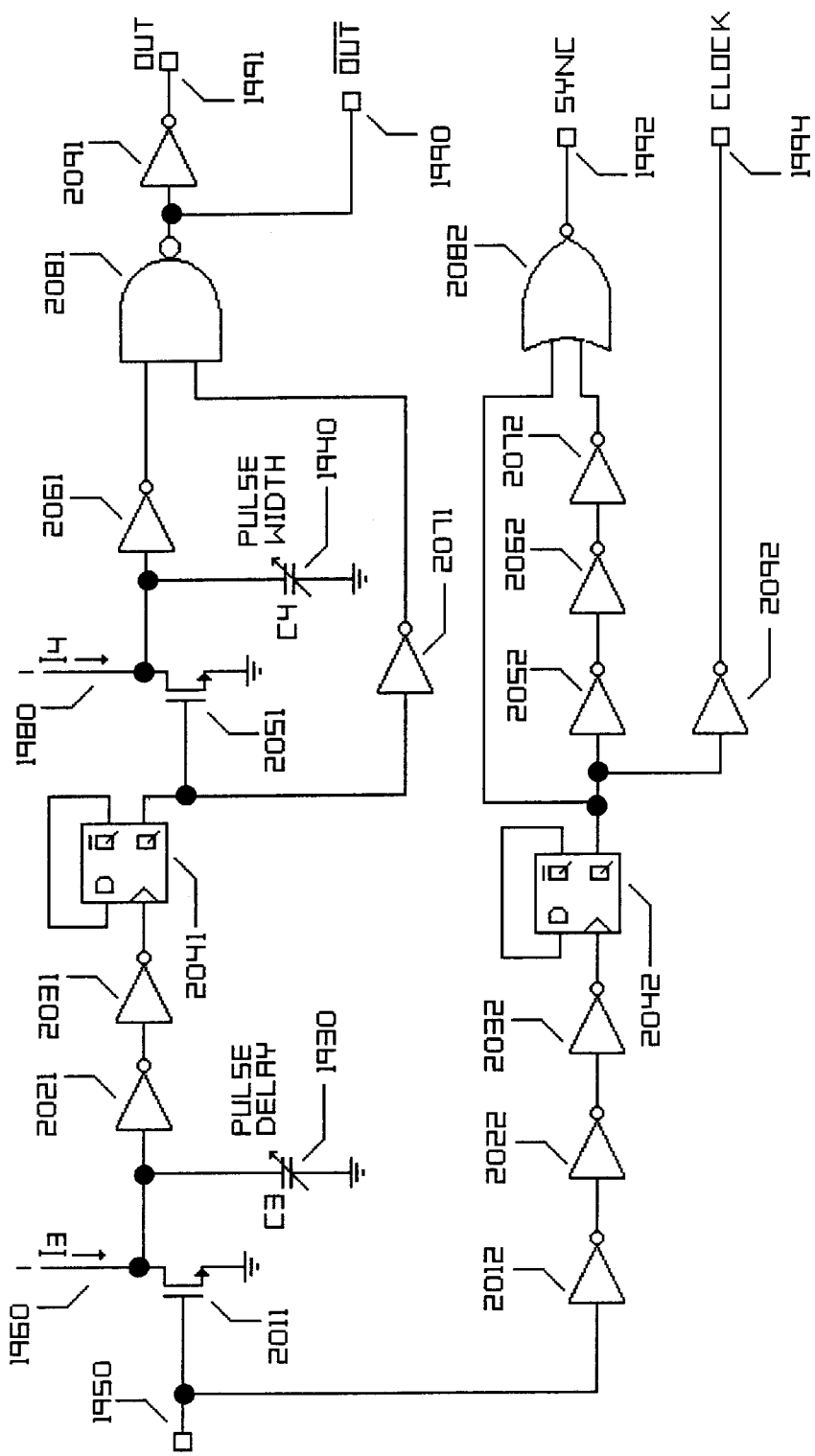
FIG. 20 depicts the internal circuitry for generating the pulse delay and pulse width of FIG. 19.

FIG. 20 discloses in detail the circuit structure of the pulse control circuit 1910 of FIG. 19. Pulse control circuit 1910 has an input 1950 for receiving an input signal. Pulse control circuit of FIG. 20 has a first and a second input 1960 and 1980 for receiving currents I3 and I4 from the current mirror 1920 of FIG. 19. The pulse control circuit has first and second N channel MOS transistors 2011 and 2051 for sinking input currents I3 and I4. In addition the pulse control circuit includes inverters 2021, 2031, 2061, 2071 2091, 2012, 2022, 2032, 2052, 2062, 2072 and 2092. The pulse control circuit also has first and second flip-flops 2041 and 2042. A NAND gate 2081 and a NOR gate 2082 are also included in the pulse control circuit.

The pulse control circuit 1910 operates in the following manner. A periodic signal is applied to the input 1950. When the input is high (logic 1), MOS transistor 2011 sinks the input current I3 thereby maintaining a low voltage on the capacitor 1930. A logic 0 condition exists at the output of inverter 2031. When the clock input 1950 transitions low, transistor 2011 turns off, and capacitor 1930 then charges to a logic 1 voltage. The output of inverter 2031 transitions to a logic 1 changing the state of flip-flop 2041. As such a delay occurs from the input 1950 to the output of the flip-flop 2041. This delay is proportional to the capacitance C3 of capacitor 1930.

The flip flop 2041 is connected to divide the input frequency by two. Each output transition of the flip-flop is delayed by the delay interval set by capacitor 1930. When the Q output transition from high to low, transistor 2051 turns off and capacitor 1940 charges. The output of inverter 2061 shall transition from high to low after the delay set by capacitor 1940. However, the output of inverter 2071 transitions low to high with minimal delay at the falling edge of the Q output of flip-flop 2041. As such, output of the NAND gate 2081 produces a low output having a width corresponding to the delay set by capacitor 1940. The inverter 2091 inverts the output of the NAND gate and provides a positive pulse at the OUT output 1991.

When the input 1950 transitions low, the output of inverter 2032 transitions high, producing a change in state in flip-flop 2042. This transition occurs with minimal delay. In fact the delay of inverters 2022 and 2032 match the delay of inverters 2021 and 2031. As such, flip-flop 2042 shall divide the input frequency by two, without the delay set by capacitor 1930. When the Q output of the flip-flop 2042 transitions from high to low, the transition is applied without delay to first input of NOR gate 2082. After a very short delay produced by inverters 2052, 2062 and 2072, a low to high transition is applied to the second input of NOR gate 2082. The output of the NOR gate 2082 produces a narrow positive voltage pulse at the SYNC output 1992.

As shown by FIG. 20, the pulse control circuit 1910 provides both true and compliment pulse outputs at 1991 and 1990 respectively. The pulse control circuit also provides a SYNC output 1992 and a CLOCK output 1994. CLOCK output 1994 has a duty cycle close to 50 per cent. The pulse output OUT 1991 is delayed from the positive edge of the SYNC output. Both the pulse delay and pulse width are proportional to the period of the signal output of the current to frequency converter 440. Therefore, the width and delay shall track the period as the frequency is being set by adjusting capacitor 401.

The pulse generator of FIG. 19 provides distinct advantages over prior art pulse generator circuits. Because the pulse width and delay are proportional to the period, the delay and width shall not 'alias' or exhibit modes as the frequency is increased. Likewise, a specific value of duty cycle is maintained as the frequency is increased or decreased. Very often adjusting the frequency of prior art pulse generators is very frustrating, because pulse width and delay must be adjusted if the output frequency changes significantly.

The present invention produces an output frequency in response to the frequency of a signal applied to the input. As such, it becomes possible to produce modulation between these two frequencies. If this modulation occurs, and the circuit has significant sensitivity to the beat frequencies, then significant phase jitter shall exist at the output. To prevent phase jitter on the output signal the design shall sometimes require carefull attention to reduce sensitivity to the modulation or reduce the magnitude of the modulation. In some applications high frequency design techniques shall be required.

A specific example of reducing phase jitter is to increase the capacitance on the common gate node of the first and second current source MOSFETs. This capacitance shall attenuate the high frequency signals coupled to the common gate node. Since the common gate node is the output of charge pump 571 of FIG. 5, the added capacitance attenuates the high frequency component of the signal on the output of charge pump 571. In addition the added capacitance attenuates the switching noise coupled from the current to frequency converter 440. Such a noise decoupling capacitor must have a low effective series resistance at high frequencies. In integrated circuits, the effective resistance of polysilicon or a buried diffusion must be reduced.

Often a trade off exits between capacitance per unit area and the effective series resistance. Such a trade off must be evaluated properly in order to reduce phase jitter. A method to reduce the effective series resistance on capacitors is to minimize the distance from regions of active capacitance to the metal contacts. Making extra metal contacts to the bottom plate of the capacitor requires more area for a specific value of capacitance.

Another example to reduce modulation is to use a ladder filter structure between the output of pump 571 and the gate of current source MOSFET 532 in FIG. 5. The ladder filter comprises multiple stages, each stage has a capacitor connected to a power supply node, followed by a series resistor. The series resistor of each stage is connected between the capacitor of that stage and the capacitor of the next stage of the ladder filter. The capacitors connected to the gates of the first and second current source MOSFETs 531 and 532 of FIG. 5. reduce high frequency coupling to the gates of the current source MOSFETs. The resistors and capacitors of the ladder filter provide additional attenuation of signals coupling between the current source MOSFETs.

Another specific example to reduce jitter is to reduce the digital switching noise. Switching noise is reduced by reducing the series resistance of the power supply distribution of VDD and VSS. Likewise, switching noise is reduced by reducing the package inductance to the VSS and VDD pins.

The digital switching noise is also significantly reduced by utilizing low noise output drivers. Low noise output driver circuit topologies are disclosed in detail in U.S. Pat. No. 4,947,063, U.S. Pat. No. 4,791,521 and U.S. Pat. No. 4,783,601.

U.S. Pat. No. 4,947,063 is hereby incorporated entirely by reference.

U.S. Pat. No. 4,791,521 is hereby incorporated entirely by reference.

U.S. Pat. No. 4,783,601 is hereby incorporated entirely by reference.

The use of these circuits as output drivers shall significantly reduce the digital switching noise and modulation.

When the beat frequency is very low, then capacitance becomes an ineffective technique to reduce phase jitter. As such, when the phase jitter occurs from low frequency modulation, then differential circuit topologies must be utilized to reduce noise by common mode rejection.

All of the disclosed embodiments of the subject invention include a tunable oscillator having a node for receiving an input signal as a source of input frequency, a first capacitor, a second capacitor, a self calibrating frequency to current converter, a self calibrating current to frequency converter and an output. The invention provides a significant improvement in the performance and the cost for many applications that require a tunable source of frequency.

I claim:

1. A tunable oscillator comprising:
    an input for receiving an input signal having an input frequency;
    an output for providing an output signal having an output frequency;
    a first capacitor;
    a second capacitor;
    a frequency to current converter having a first terminal connected to the input for receiving an input signal and a second terminal connected to said first capacitor; and
    a current to frequency converter responsive to the current of the frequency to current converter, having a first terminal connected to said second capacitor, and an output terminal connected to said output for providing an output signal.

2. A tunable oscillator as recited in claim 1, wherein the frequency to current converter is self calibrating.

3. A tunable oscillator as recited in claim 1, wherein the current to frequency converter is self calibrating.

4. A tunable oscillator as recited in claim 1, wherein the frequency to current converter is self calibrating, and the current to frequency converter is self calibrating.

5. A tunable oscillator as recited in claim 1, wherein said first capacitor is a variable capacitor.

6. A tunable oscillator as recited in claim 1, wherein said first capacitor is a fixed capacitor.

7. A tunabale oscillator as recited in claim 1, wherein said second capacitor is a variable capacitor.

8. A tunabale oscillator as recited in claim 1, wherein said second capacitor is a fixed capacitor.

9. A tunabale oscillator as recited in claim 5, wherein the variable capacitor is continously variable.

10. A tunabale oscillator as recited in claim 7, wherein the variable capacitor is continously variable.

11. A tunable oscillator as recited in claim 5, wherein the variable capacitor further comprises a switched capacitor digital to analog converter.

12. A tunable oscillator as recited in claim 7, wherein the variable capacitor further comprises a switched capacitor digital to analog converter.

13. A tunable oscillator as recited in claim 1, wherein the tunable oscillator further comprises:
    a cystal oscillator having an output for driving a quartz crystal, an input responsive to to the signal from the quartz crystal and an amplifying stage;
    a capacitor connected from the output of the cystal oscillator to a power supply node;
    a capacitor connected from the crystal oscillator input to a power supply node; and
    means to connect the input and the output of said crystal oscillator to a quartz crystal.

14. The tunable oscillator of claim 13, wherein the cystal oscillator is connected to the input of the frequency to current converter.

15. The tunable oscillator of claim 14, wherein said frequency to current converter is self calibrating.

16. The tunable oscillator of claim 15, wherein said self calibrating frequency to current converter is connected to said first capacitor.

17. The tunable oscillator of claim 16, wherein said first capacitor is fixed.

18. The tunable oscillator of claim 16, wherein said capacitor is a variable capacitor.

19. The tunable oscillator of claim 18, wherein the first capacitor is a switched capacitor digital to analog converter.

20. The tunable oscillator of claim 1, further comprising a frequency meter for indicating the output frequency of said tunable oscillator.

21. The tunable oscillator of claim 1, further comprising means for measuring and displaying the output frequency.

22. A tunable oscillator comprising:
    an input for receiving an input signal having an input frequency;
    an output for providing an output signal having an output frequency;
    a first capacitor;
    a second capacitor;
    a self calibrating frequency to current converter having a first input connected to the input for receiving an input signal, and a second input connected to the first capacitor, the frequency to current converter producing a current proportional to both the input frequency and capacitance of said first capacitor; and
    a self calibrating current to frequency converter responsive to the current of the frequency to current converter, having an input connected to the second capacitor, and an output connected to the tunable oscillator output.

23. The tunable oscillator of claim 22, wherein the self calibrating frequency to current converter further comprises:
    a binary counter having an input for receiving an input signal, the binary counter input having a connection to the tunable oscillator input, the binary counter also having a plurality of control outputs;
    a current source MOSFET having a drain, a gate and a source;
    a differential current switch having an input for receiving the drain current of the current source MOSFET, an output connected to said first capacitor of the tunable oscillator, and a control input connected to the binary counter;
    a comparator having a switching threshold voltage, an input connected to the first capacitor, and a comparator output; and
    a charge pump having an input connected to the comparator output, and a charge pump output connected to the gate of the current source MOSFET.

24. The tunable oscillator of claim 22, wherein the self calibrating current to frequency converter further comprises:
    a voltage controlled oscillator (VCO) having an input for controlling the VCO frequency, and an output connected to the output of said tunable oscillator;
    a binary counter having an input for receiving an input signal, the binary counter input connected to the output of the voltage controlled oscillator, and a plurality of control outputs;
    a current source MOSFET having a drain, a gate and a source;
    a differential current switch having a current input connected to the drain of said current source MOSFET, an output connected to said second capacitor, and a control input to the binary counter;
    a comparator having a switching threshold voltage, an input connected to said second capacitor of the tunable oscillator and a comparator output; and
    a charge pump having an input connected to the comparator output and a pump output connected to the input of the voltage controlled oscillator.

25. The tunable oscillator of claim 23, wherein the first capacitor is a fixed capacitor.

26. The tunable oscillator of claim 23, wherein the first capacitor is continuously variable.

27. The tunable oscillator of claim 23, wherein the first capacitor is a switched capacitor digital to analog converter, having an output and a plurality of digital inputs.

28. The tunable oscillator of claim 24, wherein the second capacitor is a fixed capacitor.

29. The tunable oscillator of claim 24, wherein the second capacitor is continuously variable.

30. The tunable oscillator of claim 24, wherein the second capacitor is a switched capacitor digital to analog converter.

31. The tunable oscillator of claim 27, further comprising a digital code input port used to set the frequency of the tunable oscillator.

32. The tunable oscillator of claim 31 further comprising:
- a binary counter having an input for receiving an input signal, the counter input connected to the tunable oscillator output, and a plurality of outputs, each output producing binary weighted output frequency;
- a digital multiplexer for selecting an output frequency, having a plurality of digital inputs connected to the binary weighted frequency outputs of the binary counter, a multiplexer output connected to the output of said tunable oscillator, and a plurality of digital control inputs for selecting one digital inputs;
- a decode logic circuit responsive to the digital code applied to the digital code input port, having a plurality of outputs connected to the digital control inputs of the digital multiplexer; and
- a dac control logic circuit having a plurality of digital outputs connected to the inputs of said switched capacitor digital to analog converter.

33. The tunable oscillator of claim 23, further comprising a crystal oscillator circuit having an output connected to the input of said tunable oscillator.

34. The tunable oscillator of claim 31, further comprising a crystal oscillator circuit having an output connected to the input of said tunable oscillator.

35. The tunable oscillator of claim 30, further comprising a crystal oscillator circuit having an output connected to the input of said tunable oscillator.

36. The tunable oscillator of claim 22, further comprising a digital frequency meter for indicating the output frequency of said tunable oscillator.

37. The tunable oscillator of claim 22, further comprising means for measuring and displaying the output frequency.

38. The tunable oscillator of claim 26, further comprising means for measuring and displaying the output frequency.

39. The tunable oscillator of claim 29, further comprising means for measuring and displaying the output frequency.

40. The tunable oscillator of claim 22, further comprising a crystal oscillator circuit having an output connected to the input of said tunable oscillator.

41. The tunable oscillator of claim 26, further comprising a crystal oscillator circuit having an output connected to the input of said tunable oscillator.

42. The tunable oscillator of claim 29, further comprising a crystal oscillator circuit having an output connected to the input of said tunable oscillator.

43. A method for converting an input signal having a fixed frequency into an output signal having an adjustable frequency comprising the steps of:
- charging a first capacitor with a first adjustable current source during a charge interval, the charge interval being an integer number of cycles of the input signal;
- comparing the voltage across said first capacitor at the end of the charge interval to a compare voltage;
- adjusting the current of the first adjustable current source in response to comparing the voltage of the first capacitor to the compare voltage;
- replicating the current of the first adjustable current source using a current mirror;
- charging a second capacitor with the current output from the current mirror, during a charge interval, that is an integer number of cycles of a controlled oscillator;
- comparing the voltage across the second capacitor to a compare voltage at the end of the charge interval that is an integer number of cycles of the controlled oscillator; and
- adjusting the frequency of the controlled oscillator in response comparing the voltage of the second capacitor to the compare voltage.

44. The method as recited in claim 43, wherein said compare voltage is a reference voltage.

45. The method as recited in claim 43, wherein said compare voltage is the switching threshold voltage of a CMOS inverter.

* * * * *